United States Patent
Murakami

(10) Patent No.: US 8,562,873 B2
(45) Date of Patent: Oct. 22, 2013

(54) FLAME RETARDER COMPOSITION

(75) Inventor: Fumiki Murakami, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 1520 days.

(21) Appl. No.: 10/575,262

(22) PCT Filed: Nov. 5, 2004

(86) PCT No.: PCT/JP2004/016420
§ 371 (c)(1), (2), (4) Date: Apr. 10, 2006

(87) PCT Pub. No.: WO2005/044951
PCT Pub. Date: May 19, 2005

(65) Prior Publication Data
US 2007/0040154 A1    Feb. 22, 2007

(30) Foreign Application Priority Data

Nov. 7, 2003  (JP) .................. 2003-377975

(51) Int. Cl.
*C09K 21/12*  (2006.01)
(52) U.S. Cl.
USPC ............ 252/609; 252/601; 525/14; 525/16; 525/20; 525/538
(58) Field of Classification Search
USPC ............ 252/601, 609; 525/14, 16, 20, 538
See application file for complete search history.

(56) References Cited

U.S. PATENT DOCUMENTS

| | | | | |
|---|---|---|---|---|
| 4,065,546 A | * | 12/1977 | Kao ............ | 423/300 |
| 6,528,559 B1 | * | 3/2003 | Nakacho et al. ............ | 524/116 |
| 2003/0040643 A1 | | 2/2003 | Nakano et al. | |
| 2003/0114606 A1 | * | 6/2003 | Taniguchi et al. ............ | 525/523 |
| 2005/0004292 A1 | * | 1/2005 | Harashina et al. ............ | 524/430 |
| 2005/0228087 A1 | | 10/2005 | Murakami et al. | |

FOREIGN PATENT DOCUMENTS

| | | |
|---|---|---|
| CA | 2335948 A1 | 1/2000 |
| DE | 19828536 A1 | 12/1999 |
| DE | 10196566 T1 | 7/2003 |
| DE | 10392639 | 6/2005 |
| EP | 0945478 A1 | 9/1999 |
| EP | 1452567 A1 | 9/2004 |
| JP | 11-181429 A | 7/1999 |
| JP | 2000-256551 A | 9/2000 |
| JP | 2000-336261 A | 12/2000 |
| JP | 2001-247870 A | 9/2001 |
| JP | 2003-342482 A | 12/2003 |
| JP | 2004-2892 A | 1/2004 |
| WO | WO-00/00541 A1 | 1/2000 |
| WO | WO-03/002606 A2 | 1/2003 |
| WO | WO-03/046083 A1 | 6/2003 |
| WO | WO-03/099928 A1 | 12/2003 |

OTHER PUBLICATIONS

"Epoxy Jushi Soseibutsu oyobi Jushi Fudomegata Handotai Sochi", Toshiba Gijutsu Kokaishu, 2001, vol. 19, No. 5, pp. 43-53.
Hajime Nishihara, "HiHalogen Hirinnannenka Gijutsu <sono 2>", Rubber and Plastics, 2000, vol. 52, No. 10, pp. 46-60.
English language translation of JP 2000256551 A (Sep. 19, 2000).
English language translation of JP 2001247870 A (Sep. 14, 2001).
German Office Action dated Jun. 15, 2009, issued in German Application No. 11 2004 002 030.1-43 (with partial English translation (3 pages)).

* cited by examiner

*Primary Examiner* — Mark Kopec
*Assistant Examiner* — Haidung Nguyen
(74) *Attorney, Agent, or Firm* — Birch, Stewart, Kolasch & Birch, LLP

(57) ABSTRACT

A flame retardant resin composition comprising a specified metal oxide and/or trivalent phosphorus compound (A) and a specified phosphazene compound (B) together with an aromatic resin (C) added according to necessity. This flame retardant composition when mixed into resins, can provide resin compositions excelling in flame resistance, low smoke emission, heat resistance, moisture absorption resistance, dielectric performance, extrudability, mold release, thermal stability, mechanical properties, etc.

23 Claims, No Drawings

FLAME RETARDER COMPOSITION

TECHNICAL FIELD

The present invention relates to a flame retardant composition. More particularly, it relates to a flame retardant composition which is excellent in processability, flame retardance, moisture absorption resistance, heat resistance and extrudability when added to resins.

BACKGROUND ART

Hitherto, for flame retardation of flammable resins, there have been employed methods of adding chlorine-containing compounds, bromine-containing compounds, antimony trioxide or the like to resins. However, use of these compounds is considered undesirable from the viewpoint of environmental protection and from the aspect of toxicity, and improvement of the method of flame retardation is demanded. As a flame retardation method using no chlorine-containing flame retardants or bromine-containing flame retardants, it is attempted to use phosphorus-based flame retardants.

The mechanism of the flame retardation using the phosphorus-based flame retardants is considered that a film of carbonized layer produced by dehydration of resin and polyphosphoric acid phase formed on the surface of the resin during burning intercepts the supply of heat and oxygen to the resin during burning. This method is particularly effective for resins which readily form the carbonized film, namely, which is readily dehydrated. On the other hand, when resins which can hardly form the carbonized film by the dehydration are flame retarded with phosphorus and phosphorus compounds, the flame retardation must be relied mainly upon the polyphosphoric acid phase film and, hence, the amount of phosphorus and phosphorus compound must be increased. Therefore, in order to flame retard the resins which can hardly form the carbonized film without increasing the amount of phosphorus and phosphorus compound, there occurs an idea to use a flame retardant composition which previously contains a component which acts as a starting material for the carbonized film.

Patent Document 1 proposes a method of using a crosslinked phosphazene compound and a polyphenylene ether resin as a flame retardant for polyalkylene arylate resins. According to this method, satisfactory flame retardance is imparted to polyalkylene arylate resins. However, processability, heat resistance, mechanical properties, dielectric properties of the resins and appearance of molded articles cannot be sufficiently satisfied.

Furthermore, Patent Document 2 proposes a flame retardant composition comprising a low-molecular weight polyphenylene ether resin and a phosphazene compound, and Patent Document 3 proposes a flame retardant composition comprising a low-molecular weight polyphenylene ether resin and a phosphorus compound other than phosphazene, and these flame retardant compositions are effective from the viewpoints of flame retardance and molding processability. However, demands for molding processability, mechanical properties, dielectric properties and heat resistance and reduction in the amount of flame retardants are everlasting and further improvement in these points is desired.

Furthermore, Patent Document 4 proposes a composite flame retardant comprising a metal element-containing compound and an aromatic group-containing phosphazene compound. However, Patent Document 4 does not disclose specific examples of the metal element-containing compounds used therein. Moreover, silicon compounds, magnesium hydroxide and the like used in Patent Document 4 tend to deteriorate the dielectric properties. Therefore, the flame retardant proposed in Patent Document 4 is not preferred in the fields which require dielectric properties, such as electric and electronic uses, and flame retardants which do not cause deterioration of dielectric properties are demanded.

Patent Documents 5-7 disclose resin compositions comprising in combination an aromatic resin, a phosphazene compound and a metal compound. These patent documents do not disclose which compounds are specifically meant by the metal compounds and which metal oxides, metal hydroxides, etc. are specifically included. Furthermore, the metal hydroxides used in Patent Documents 5-7 are not preferred because they tend to deteriorate dielectric properties and mechanical properties. These conventional technologies do not teach the effects to improve and maintain in well-balanced state various properties such as heat resistance, moisture absorption resistance, mechanical properties, dielectric properties, extrudability and low smoke emission in addition to flame retardance. These excellent effects have been obtained for the first time by the present invention as explained hereinafter.

Patent Document 1: WO03/002666
Patent Document 2: PCT/JP03/06581
Patent Document 3: Japanese Patent Application No. 2003-294180
Patent Document 4: JP-A-2001-247870
Patent Document 5: JP-A-2003-342482
Patent Document 6: WO03/046083
Patent Document 7: WO00/00541

DISCLOSURE OF INVENTION

Problem to be Solved by the Invention

The object of the present invention is to provide a flame retardant composition which does not contain chlorine compounds and bromine compounds and which is excellent in flame retardance, moisture absorption resistance, heat resistance, dielectric properties and low smoke emission, and extrudability when it is added to resins.

Means for Solving the Problem

As a result of intensive research conducted by the inventors in an attempt to solve the above problems, it has been found that by using a flame retardant composition comprising (A) at least one compound selected from the group consisting of (A-1) a metal oxide having a specific metal element and (A-2) a trivalent phosphorus compound, (B) a specific phosphazene compound and, if necessary, (C) an aromatic resin, formation of a carbonized film on the surface of resin can be accelerated and a stable flame retardance can be imparted to resin on which a carbonized film can hardly be formed, and a flame retardant resin composition having excellent heat resistance, hydrolytic resistance, mechanical properties, and dielectric properties, low smoke emission, and high extrudability and good appearance of molded articles can be obtained. Thus, the present invention has been accomplished.

That is, the present invention comprises the followings.
1. A flame retardant composition comprising (A) at least one compound selected from the group consisting of (A-1) a metal oxide represented by the formula $M_xO_y$ (in the formula, M is at least one element selected from elements of Groups 5, 8, 10 and 11 of the Periodic Table, and x and y satisfy $0<x\leq5$ and $0<y\leq5$, respectively) and (A-2) a trivalent phosphorus compound and (B) at least one phosphazene compound having a difference of 40-100° C. between the temperature at which the weight reduction is 50% by weight and the temperature at which the weight reduction is 5% by weight when it is heated from room temperature to 600° C. at a heating rate of 10° C./min in an inert gas atmosphere according to TGA.

2. The flame retardant composition described in the above 1 which comprises 0.1-60 parts by weight of the component (A) and 99.9-40 parts by weight of the component (B) in 100 parts by weight of the component (A) and the component (B) in total.
3. The flame retardant composition described in the above 1 or 2, wherein the component (B) has an acid value of not more than 1.0 and the component (B) has a water content of not more than 1000 ppm measured at 150° C. according to Karl Fischer's method.
4. The flame retardant composition described in any one of the above 1-3, wherein the temperature at which the weight reduction of the component (B) is 50% by weight is 320-460° C. when it is heated from room temperature to 600° C. at a heating rate of 10° C./min in an inert gas atmosphere according to TGA.
5. The flame retardant composition described in any one of the above 1-4, wherein the metal M in the component (A-1) is at least one metal selected from the group consisting of V, Nb, Fe, Ni, Pd, Pt, Cu, Ag and Au.
6. The flame retardant composition described in any one of the above 1-4, wherein the component (A-1) is at least one compound selected from the group consisting of iron oxide, nickel oxide, palladium oxide and copper oxide.
7. The flame retardant composition described in any one of the above 1-6, wherein the temperature at which the weight reduction of the component (A-2) is 10% by weight is 120-320° C. when it is heated from room temperature to 600° C. at a heating rate of 10° C./min in an inert gas atmosphere according to TGA.
8. The flame retardant composition described in any one of the above 1-6, wherein the component (A-2) is at least one of tertiary phosphines.
9. The flame retardant composition described in any one of the above 1-6, wherein the component (A-2) is at least one of triarylphosphines.
10. The flame retardant composition described in any one of the above 1-9 which further contains (C) an aromatic group-containing resin.
11. The flame retardant composition described in the above 10, wherein the component (C) is at least one resin selected from the group consisting of polyphenylene ether resins, polycarbonate resins, polyphenylene sulfide resins, phenolic resins, aromatic polyamide resins, polyester resins and thermotropic liquid crystals.
12. The flame retardant composition described in the above 10, wherein the component (C) is a polyphenylene ether resin.
13. The flame retardant composition described in any one of the above 10-12, wherein the weight ratio of the component (C) and the component (B) is (C)/(B)=95/5–5/95.
14. A flame retardant resin composition which comprises the flame retardant composition described in any one of the above 10-13.
15. A flame retardant resin composition which contains (a) a resin and (b) the flame retardant composition described in any one of the above 1-13.
16. The flame retardant resin composition described in the above 15 which contains 1-1000 parts by weight of the component (b) based on 100 parts by weight of the component (a).
17. The flame retardant resin composition described in the above 15 or 16, wherein the component (a) comprises at least one thermoplastic resin selected from the group consisting of polycarbonate resins, polyphenylene ether resins, polyphenylene sulfide resins, polypropylene resins, polyethylene resins, polystyrene resins, ABS resins, polyalkylene terephthalate resins, polyamide resins, thermotropic liquid crystals and elastomer-containing polystyrenes.
18. The flame retardant resin composition described in the above 15 or 16, wherein the component (a) is at least one resin selected from the group consisting of polyphenylene ether resins, polycarbonate resins, polystyrene resins, ABS resins and elastomer-containing polystyrenes, and the component (A-1) in the flame retardant composition which is the component (b) is iron oxide and/or copper oxide.
19. The flame retardant resin composition described in the above 15 or 16, wherein the component (a) is at least one resin selected from the group consisting of polyphenylene ether resins, polycarbonate resins, polystyrene resins, ABS resins and elastomer-containing polystyrenes, and the component (A-2) in the flame retardant composition which is the component (b) is at least one phosphine selected from triarylphosphines.
20. The flame retardant resin composition described in the above 15 or 16, wherein the component (a) comprises at least one hardening resin selected from the group consisting of unsaturated polyester resins, vinyl ester resins, diallyl phthalate resins, epoxy resins, cyanate resins, xylene resins, triazine resins, phenolic resins, urea resins, melamine resins, benzoguanamine resins, urethane resins, ketone resins, alkyd resins, furan resins, oxetane resins, styrylpyridine resins and synthetic rubbers.
21. The flame retardant resin composition described in the above 15 or 16, wherein the component (a) is an epoxy resin, and the component (A-1) in the flame retardant composition which is the component (b) is at least one oxide selected from nickel oxide, palladium oxide, iron oxide and copper oxide.
22. The flame retardant resin composition described in the above 15 or 16, wherein the component (a) is an epoxy resin, and the component (A-2) in the flame retardant composition which is the component (b) is at least one phosphine selected from triarylphosphines.
23. A flame retardant resin composition which comprises (a) a resin and (b) the flame retardant composition described in the above 12, wherein the component (a) is an epoxy resin, and the component (C) in the flame retardant composition which is the component (b) is a polyphenylene ether resin having a number average molecular weight of 500-5000.
24. A molded article comprising the flame retardant resin composition described in any one of the above 14-23.

BEST MODE FOR CARRYING OUT THE INVENTION

The present invention will be explained in detail below.

In the present invention, (A) (A-1) a specific metal oxide and/or (A-2) a trivalent phosphorus compound, and (B) a specific phosphazene compound are essential components. By suitably combining these components, growth of carbonized layer is accelerated when heated at high temperatures and excellent flame retardance and various properties can be obtained with addition of them in a small amount. Furthermore, (C) an aromatic resin can be added as a third component for efficient formation of the carbonized layer.

The components will be explained below.

(A) Specific Metal Oxide and/or Trivalent Phosphorus Compound:

(A-1) Metal Oxide ($M_xO_y$; in the Formula, M is at Least One Element Selected from the Elements of Groups 5, 8, 10 and 11 of the Periodic Table):

The metal oxide suitably used in the present invention is represented by the formula $M_xO_y$, wherein x and y satisfy $0 < x \leq 5$ and $0 < y \leq 5$, respectively. In the present invention, it is important to use a metal oxide having a specific element as a central metal element. That is, it is important in the present invention to use a metal oxide containing an element of Groups 5, 8, 10 and 11 of the Periodic Table. In a case where metal oxides having an element belonging to other groups are used, the desired effects of the present invention cannot sufficiently be obtained. Furthermore, some of them tend to hydrolyze resins when added to resins and hence are not preferred. For example, metal oxides such as sodium oxide, potassium oxide, cesium oxide, calcium oxide, magnesium oxide, molybdenum oxide, aluminum oxide and thallium oxide are high in moisture absorption and solubility in water. Therefore, when these metal oxides are added, they tend to hydrolyze resins, particularly, polycarbonate resins, polyamides, polyesters, etc. and thus they are not preferred.

Examples of the metal oxides containing an element of Groups 5, 8, 10 and 11 of the Periodic Table which are suitably used in the present invention are vanadium oxide, niobium oxide, tantalum oxide, iron oxide, ruthenium oxide, osmium oxide, nickel oxide, palladium oxide, platinum oxide, copper oxide, silver oxide, and gold oxide. Considering the balance with flame retardance, mechanical properties, safety and the like, vanadium oxide, niobium oxide, iron oxide, nickel oxide, palladium oxide, platinum oxide, copper oxide, silver oxide, and gold oxide are suitable among these metal oxides.

Furthermore, from the viewpoints of moisture absorption resistance and avoidance of using halogen, it is preferred that amount of chlorine contained in the component (A-1) is not more than 2.0% by weight, preferably not more than 1.0% by weight and more preferably not more than 0.5% by weight.

The particle diameter of the metal oxide suitably used in the present invention is not particularly limited, and conventionally known particle diameter can be suitably used. When the dispersibility of the metal oxide must be taken into consideration, it is preferred that the particle diameter is not more than 100 μm, preferably not more than 50 μm, more preferably not more than 10 μm, further preferably not more than 5 μm, especially preferably not more than 1 μm.

The metal oxide may be used each alone or as a mixture of two or more. Furthermore, the metal oxide may be coated with an optional inorganic material and/or organic material.

(A-2) Trivalent Phosphorus Compound:

Conventionally known trivalent phosphorus compounds can be used in the present invention. Considering the balance of heat resistance, flame retardance and mechanical properties, it is preferred to use trivalent phosphorus compounds having a temperature of 150-320° C. at which the weight reduction is 10% when they are heated from room temperature to 600° C. at a heating rate of 10° C./min in an inert gas atmosphere according to TGA. Examples of these trivalent phosphorus compounds are triarylphosphines, trialkylphosphines, triaryloxyphosphines, trialkoxyphosphines, etc. More specifically, triarylphosphines represented by the following formula (1) can be suitably used. In the formula, $T_1$, $T_2$, $T_3$ and $T_4$ represent independently a hydrogen atom or an alkyl group or aryl group of 1-12 carbon atoms, $T_5$ represents a hydrogen atom or a methyl group, m1, m2, m3 and m4 represent independently an integer of 0-5, m5 represents an integer of 0-4, and n represents an integer of 0-3. A naphthyl group can also be suitably used as the aryl group. The three aryl groups on the phosphorus atom may be all the same groups or may be different from each other.

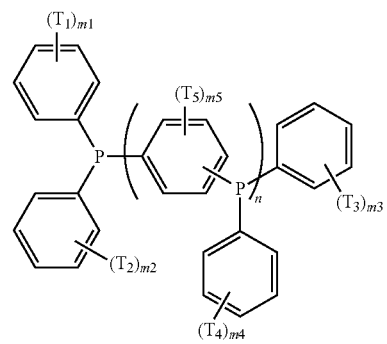

Furthermore, the trivalent phosphorus compounds may have various forms such as liquid, wax and solid though it depends on the kind of the substituents or the structure of the compounds. They may have any forms so long as the effects of the present invention are not damaged.

These trivalent phosphorus compounds may be used each alone or as a mixture of two or more.

(B) Phosphazene Compound:

Considering the extrudability, flame retardance, moisture absorption resistance, low smoke emission during burning when used in combination with the component (A), it is necessary for the phosphazene compound used in the present invention that the difference between the temperature at which the weight reduction is 50% by weight and the temperature at which the weight reduction is 5% by weight when heated from room temperature to 600° C. at a heating rate of 10° C./min in an inert gas atmosphere according to TGA is 40-100° C., suitably 40-90° C., more preferably 45-85° C., further preferably 45-75° C., especially preferably 45-70° C. Moreover, considering the retardation efficiency given by the carbonization acceleration effect in the case of using in resins, it is preferred that the temperature at which the weight reduction is 50% by weight is 320-460° C., and more preferably 350-450° C.

The phosphazene compounds used in the present invention are disclosed, for example, in James E. Mark, Harry R. Allcock, Robert West, "Inorganic Polymers" Pretice-Hall International, Inc., 1992, p61-p140. As examples of them, mention may be made of a cyclic phosphazene compound shown by the following formula (2) and/or a chain phosphazene compound shown by the following formula (3).

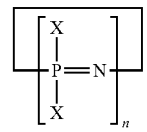

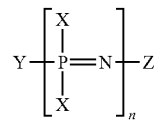

The phosphazene compounds preferably contain 95% by weight or more of the phosphazene compounds having the structures of the above formulas (2) and (3) based on the total weight of the phosphazene compounds of the component (B).

In the formulas (2) and (3), n is an integer of 3-25, and m is an integer of 3-10000. The substituents X are independently an alkyl group of 1-6 carbon atoms, an aryl group of 6-11 carbon atoms, a fluorine atom, an aryloxy group having a substituent represented by the formula (4):

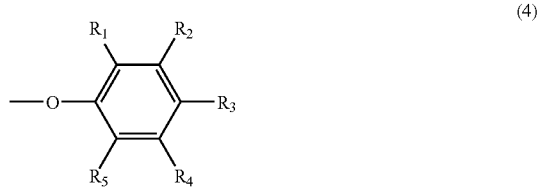

(in the formula, $R_1$, $R_2$, $R_3$, $R_4$ and $R_5$ independently represent a substituent selected from the group consisting of hydrogen atom, fluorine atom, an alkyl group of 1-5 carbon atoms, an alkoxy group of 1-5 carbon atoms, phenyl group, and a hetero atom-containing group), a naphthyloxy group, an alkoxy group of 1-6 carbon atoms, and an alkoxy-substituted alkoxy group (a part or all of hydrogen atoms on the substituents may be substituted with fluorine). Furthermore, Y in the formula represents —N=P(O)(X) or —N=P(X)$_3$, and Z represents —P(X)$_4$ or —P(O) (X)$_2$.

These compounds may be used each alone or as a mixture of two or more.

As one of the factors determining the flame retardance, mention may be made of concentration of phosphorus atom contained in the molecule. Among the phosphazene compounds, the chain phosphazene compounds having a chain structure have substituents at the molecular terminals, and, hence, are lower in phosphorus content than cyclic phosphazene compounds. Therefore, it is considered that when they are added in the same amount, the cyclic phosphazene compounds are higher in flame retardance-imparting effect than the chain phosphazene compounds. Accordingly, in the present invention, it is preferred to use phosphazene compounds having a cyclic structure, and preferred are those which contain the cyclic phosphazene compound in an amount of 95% by weight or more.

The substituents on the phosphorus atom in the phosphazene compounds (substituents X in the formulas (2) and (3)) are not particularly limited, and examples thereof are alkyl groups such as methyl group, ethyl group, n-propyl group, isopropyl group, n-butyl group, s-butyl group, tert-butyl group, n-amyl group and isoamyl group; aryl groups such as phenyl group, 2-methylphenyl group, 3-methylphenyl group, 4-methylphenyl group, 2,6-dimethylphenyl group, 3,5-dimethylphenyl group, 2,5-dimethylphenyl group, 2,4-dimethylphenyl group, 3,4-dimethylphenyl group, 4-tertiary butylphenyl group and 2-methyl-4-tertiary butylphenyl group; alkoxy groups such as methoxy group, ethoxy group, n-propyloxy group, isopropyloxy group, n-butyloxy group, tert-butyloxy group, s-butyloxy group, n-amyloxy group, isoamyloxy group, tert-amyloxy group and n-hexyloxy group; alkoxy-substituted alkoxy groups such as methoxymethoxy group, methoxyethoxy group, methoxyethoxymethoxy group, methoxyethoxyethoxy group and methoxypropyloxy group; alkyl-substituted phenoxy groups such as phenoxy group, 2-methylphenoxy group, 3-methylphenoxy group, 4-methylphenoxy group, 2,6-dimethylphenoxy group, 2,5-dimethylphenoxy group, 2,4-dimethylphenoxy group, 3,5-dimethylphenoxy group, 3,4-dimethylphenoxy group, 2,3,4-trimethylphenoxy group, 2,3,5-trimethylphenoxy group, 2,3,6-trimethylphenoxy group, 2,4,6-trimethylphenoxy group, 2,4,5-trimethylphenoxy group, 3,4,5-trimethylphenoxy group, 2-ethylphenoxy group, 3-ethylphenoxy group, 4-ethylphenoxy group, 2,6-diethylphenoxy group, 2,5-diethylphenoxy group, 2,4-diethylphenoxy group, 3,5-diethylphenoxy group, 3,4-diethylphenoxy group, 4-n-propylphenoxy group, 4-isopropylphenoxy group, 4-tertiary butylphenoxy group, 2-methyl-4-tertiary butylphenoxy group, 2-phenylphenoxy group, 3-phenylphenoxy group and 4-phenylphenoxy group; aryl-substituted phenoxy groups, naphthyl group, naphthyloxy group, etc. A part or all of hydrogen atoms of these groups may be substituted with fluorine and/or group containing hetero-atom. Here, the group containing hetero-element is a group containing B, N, O, Si, P or S atom. Examples thereof are groups containing amino group, amide group, aldehyde group, glycidyl group, carboxyl group, hydroxyl group, cyano group, mercapto group, silyl group, or the like.

Furthermore, these compounds may be crosslinked with a crosslinking group selected from the group consisting of phenylene group, biphenylene group and group (5) shown below:

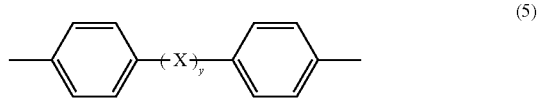

(in the formula, X represents —C(CH$_3$)$_2$—, —SO$_2$—, —S— or —O—, and y denotes 0 or 1) by a method disclosed in WO00/09518. Phosphazene compounds having these crosslinked structure are prepared, specifically, by reacting a dichlorophosphazene oligomer with an alkali metal salt of phenol and an alkali metal salt of an aromatic dihydroxy compound. These alkali metal salts are added in somewhat excess of stoichiometric amount with respect to the dichlorophosphazene oligomer.

These phosphazene compounds may be used each alone or in admixture of two or more.

Of these phosphazene compounds, preferred are those in which 90% or more of the total amount of the substituents on the phosphorus atom comprises unsubstituted or substituted phenoxy group, considering the balance of heat resistance and flame retardance.

Furthermore, the phosphazene compounds may be mixtures of the compounds differing in structure, such as cyclic compounds, e.g., cyclic trimers, tetramers and the like and chain phosphazenes, but the processability of flame retardant resin compositions tends to be enhanced with increase of the content of cyclic trimers and tetramers. Specifically, phosphazene compounds containing 80% by weight or more of cyclic trimer and/or tetramer compounds are preferred. More preferred are those which contain 70% by weight or more, more preferably 80% by weight or more of trimers.

Furthermore, the phosphazene compounds may have various forms such as liquid, wax and solid though it depends on the kind of the substituents or the structure of the compounds. They may have any forms so long as the effects of the present invention are not damaged. In the case of solid form, the bulk density is preferably 0.45 g/cm$^3$ or greater, more preferably 0.45 g/cm$^3$ or greater and 0.75 g/cm$^3$ or less.

The amount of the alkali metal component such as sodium, potassium or the like contained in the phosphazene compound is not more than 200 ppm, more preferably not more than 50 ppm based on the total weight of the phosphazene compound, and further preferably the amount of the total alkali metal components is not more than 50 ppm. Moreover, it is desired that the content of the phosphazene compound in which at least one of the substituents X in the formula (2) is hydroxyl group, namely, the cyclic phosphazene compound containing P—OH bond, is less than 1% by weight, and it is further desired that the chlorine content in the phosphazene compound is not more than 1000 ppm, preferably not more than 500 ppm, further preferably not more than 300 ppm based on the total weight of the phopshazene compound.

The phosphazene compound in which at least one of the substituents X in the formula (2) is hydroxyl group can have an oxo structure represented by the formula (6) (in the formula, a+b=n and n is an integer of 3 or more, and substituents X independently represent an aryloxy group or an alkoxy group). It is desired that the content of this oxo compound is also less than 1% by weight like the hydroxyl group-containing phosphazene compound. The same may be said of the phosphazene compound having a chain structure represented by the formula (3).

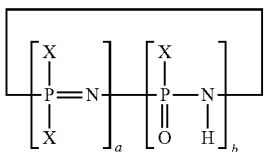

(6)

When the electric properties and the hydrolytic resistance are taken into consideration, the water content in the phosphazene compound is not more than 1000 ppm, preferably not more than 800 ppm, more preferably not more than 650 ppm, further preferably not more than 500 ppm, especially preferably not more than 300 ppm based on the total weight of the phosphazene composition (measured according to Karl Fischer's method). It is further desired that the acid value of the phosphazene compound measured according to JIS K6751 is not more than 1.0, preferably not more than 0.5.

(C) Aromatic Resin:

In the present invention, in addition to the component (A) and the component (B), an aromatic resin may be contained for acceleration of formation of the carbonized film.

The aromatic resins used in the present invention are not particularly limited as far as they can easily form the carbonized film at the time of burning, and known aromatic resins can be suitably used. One preferred example is a resin having an oxygen index of 24 or more measured in accordance with ASTM D2863 and containing 20 mol % or more of an aromatic molecule in the main chain. The content of the aromatic molecule is more preferably 30 mol % or more, further preferably 40 mol % or more, especially preferably 50 mol % or more. Examples of the aromatic resins are polyphenylene ether resins, polycarbonate resins, aromatic polyamide resins, aromatic polyester resins, phenolic resins, polyphenylene sulfide resins, etc. Among them, considering dielectric properties, heat resistance, mechanical properties, etc., polyphenylene ether resins, polycarbonate resins and polyphenylene sulfide resins are preferred, and polyphenylene ether resins are particularly preferred. These resins may be used each alone or in combination of two or more.

When the aromatic resin of the component (C) is used, the resin composition can comprise only the components (A), (B) and (C).

(C-1) Polyphenylene Ether Resin:

The polyphenylene ether resins suitably usable in the present invention are preferably homopolymers or copolymers having repeating units represented by the formula (7) and/or the formula (8).

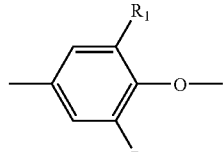

(7)

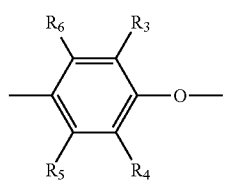

(8)

(where $R_1$, $R_2$, $R_3$, $R_4$, $R_5$ and $R_6$ represent independently an alkyl group of 1-4 carbon atoms, an aryl group or hydrogen, with a proviso that $R_5$ and $R_6$ cannot be simultaneously hydrogen).

Typical examples of the homopolymers of the polyphenylene ether resins are poly(2,6-dimethyl-1,4-phenylene) ether, poly(2-methyl-6-ethyl-1,4-phenylene)ether, poly(2,6-diethyl-1,4-phenylene)ether, poly(2-ethyl-6-n-propyl-1,4-phenylene)ether, poly(2,6-di-n-propyl-1,4-phenylene)ether, poly(2-methyl-6-n-butyl-1,4-phenylene)ether, poly(2-ethyl-6-isopropyl-1,4-phenylene)ether, poly(2-methyl-6-hydroxyethyl-1,4-phenylene)ether, etc.

Among them, poly(2,6-dimethyl-1,4-phenylene)ether is preferred, and especially preferred is a polyphenylene ether containing, as a partial structure, a 2-(dialkylaminomethyl)-6-methylphenylene ether unit or a 2-(N-alkyl-N-phenylaminomethyl)-6-methylphenylene ether unit which is disclosed in JP-A-63-301222, etc.

Here, the polyphenylene ether copolymers are copolymers having a phenylene ether structure as a main monomer unit. Examples thereof are a copolymer of 2,6-dimethylphenol and 2,3,6-trimethylphenol, a copolymer of 2,6-dimethylphenol and o-cresol, a copolymer of 2,6-dimethylphenol, 2,3,6-trimethylphenol and o-cresol, a copolymer of 2,6-dimethylphenol and a bisphenol represented by the following formula (9), etc.

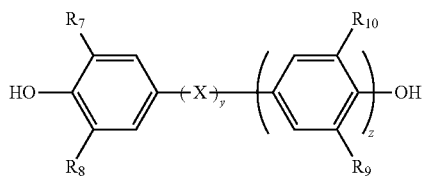

(9)

(wherein $R_7$, $R_8$, $R_9$ and $R_{10}$ independently represent an alkyl group of 1-4 carbon atoms, an aryl group or hydrogen, X represents —C(CH$_3$)$_2$—, —SO$_2$—, —S— or —O—, y represents 0 or 1, and z represents 0 or 1).

In the present invention, so long as attainment of the object of the present invention is not hindered, there may also be used modified polyphenylene ether resins obtained by introducing reactive functional groups such as carboxyl group, epoxy group, amino group, mercapto group, silyl group, hydroxyl group, and anhydrous dicarboxyl group into a part or the whole of polyphenylene ether resin by some methods such as graft reaction and copolymerization. These may be used each alone or in combination of two or more.

Modified polyphenylene ether resins obtained by modifying a part or the whole of polyphenylene ether resin with an unsaturated carboxylic acid or a functional derivative thereof are disclosed in JP-A-2-276823, JP-A-63-108059, JP-A-59-59724, etc. They are produced, for example, by melt kneading and reacting a polyphenylene ether resin with an unsaturated carboxylic acid or a functional derivative thereof in the presence or absence of a radical initiator. Alternatively, they are produced by dissolving a polyphenylene ether and an unsaturated carboxylic acid or a functional derivative thereof in an organic solvent in the presence or absence of a radical initiator to carry out the reaction of them in the state of solution.

The unsaturated carboxylic acids or functional derivatives thereof include, for example, maleic acid, fumaric acid, itaconic acid, halogenated maleic acid, cis-4-cyclohexene-1,2-dicarboxylic acid, endo-cis-bicyclo-(2.2.1)-5-heptene-2,3-dicarboxylic acid, acid anhydrides, esters, amides and imides of these dicarboxylic acids, acrylic acid, methacrylic acid, esters and amides of these monocarboxylic acids, etc. Furthermore, there may be used compounds which are saturated carboxylic acids, but per se heat decomposed at the reaction temperature in producing the modified polyphenylene ether and can become the functional derivative used in the present invention. Examples thereof are malic acid, citric acid, etc. These may be used each alone or in combination of two or more.

The molecular weight of the polyphenylene ethers usable in the present invention is not limited so long as the effects of the present invention are not damaged. Specifically, polyphenylene ethers having a number average molecular weight of 500-30000 can be suitably used. When it is necessary to obtain compositions particularly excellent in molding processability, polyphenylene ethers having a number average molecular weight of not less than 500 and not more than 5000, preferably not less than 1200 and not more than 4000 can be suitably used. In order to obtain compositions particularly excellent in heat resistance, it is preferred to use polyphenylene ethers having a number average molecular weight of more than 5000. There may be optionally used polyphenylene ethers having a molecular weight suitable for the properties particularly required for resin compositions.

(C-2) Polycarbonate Resin:

The polycarbonate resins suitably usable in the present invention are preferably polymers having a repeating unit represented by the following formula (10).

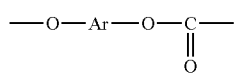

(10)

(in the formula, Ar is a divalent group of 4-200 carbon atoms which contains aromatic group, and examples thereof are phenylene, biphenylene, ter-phenylene, napthylene, and a group represented by the following formula (11)).

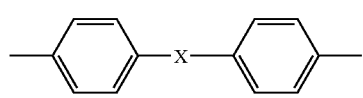

(11)

(in the formula, X is —O—, —S—, —C(O)—, —C(O)O—, —C(O)NH— or a group represented by the following formula (12) or (13)).

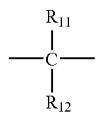

(12)

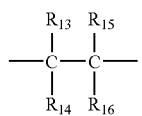

(13)

(in the formula, $R_{11}$, $R_{12}$, $R_{13}$, $R_{14}$, $R_{15}$ and $R_{16}$ independently represent a hydrogen atom, an alkyl group of 1-20 carbon atoms or an aryl group, and the hydrogen atom on the substituent may be substituted with a fluorine atom).

Furthermore, the polycarbonate resins suitably usable in the present invention may have a branched structure. In addition, polyorganosiloxane-modified polycarbonate resins modified with organosiloxane can also be suitably used (e.g., resins disclosed in JP-A-6-100684, JP-A-10-182832, etc.).

These may be used each alone or in combination of two or more.

The terminal group of the polycarbonate resins is not particularly specified as far as the effects of the present invention can be obtained.

Examples thereof are alkyl group, alkyl carbonate group, aryl group, aryl carbonate group, etc., and two or more groups may be bonded as the terminal group.

The molecular weight of the polycarbonate resins suitably usable in the present invention is not limited so long as the effects of the present invention are not damaged. Specifically, polycarbonate resins having a number average molecular weight (calculated in terms of polystyrene) of 1000-100000, preferably 2000-70000, more preferably 5000-25000 can be suitably used. There may be used polycarbonate resins having a molecular weight suitable for the properties particularly required for the resulting resin compositions.

The method for producing the polycarbonate resins suitably usable in the present invention is not limited, and conventionally known methods can be widely used. For example, polycarbonate resins produced by phosgene method, ester exchange method, etc. can be suitably used.

(C-3) Aromatic Polyamide Resin:

The aromatic polyamide resins suitably usable in the present invention are not particularly limited, and conventionally known aromatic polyamide resins can be widely used as far as they exert the effects of the present invention. Examples of the aromatic polyamide resins are homopolymers and copolymers obtained by appropriately combining polyamide-forming monomers such as ∈-caprolactam, adipic acid, sebacic acid, dodecanoic diacid, isophthalic acid, terephthalic acid, hexamethylenediamine, tetramethylenediamine, 2-methylpentamethylenediamine, 2,2,4-trimethylhexamethylenediamine, 2,4,4-trimethylhexamethylenediamine, m-xylylenediamine, and bis(3-methyl-4-aminocyclohexyl)methane, and mixtures of these homopolymers and copolymers.

Specific examples of them are polyamide 6I, polyamide 6T, polyamide 9T, polyamide MXD6, polyamide 66/6I, polyamide 66/6T, polyamide 6T/6I, polyamide 66/6I/6, polyamide 66/6I/11, polyamide 66/6I/12, polyamide 66/6I/610, polyamide 66/6I/612, etc. These may be used each alone or in admixture of two or more.

The molecular weight of the polyamide resins in the present invention is not limited, and those which have a relative viscosity in sulfuric acid (shown in JIS K6810) of 1.5-3.5 can be suitably used.

(C-4) Thermotropic Liquid Crystal:

The thermotropic liquid crystals suitably usable in the present invention are not particularly limited, and conventionally known thermotropic liquid crystals can be widely used as far as they exert the effects of the present invention. Examples thereof include, but are not limited to, thermotropic liquid crystal polyesters having p-hydroxybenzoic acid and ethylene terephthalate as main constitutional units, thermotropic liquid crystal polyesters having p-hydroxybenzoic acid and 2-hydroxy-6-naphthoic acid as main constitutional units, thermotropic liquid crystal polyesters having p-hydroxybenzoic acid, 4,4'-hydroxybiphenyl and terephthalic acid as main constitutional units, etc.

If necessary, into the thermotropic liquid crystals suitably usable in the present invention may be introduced constitutional units produced from other aromatic dicarboxylic acids, aromatic diols or aromatic hydroxycarboxylic acids in such a small amount as not damaging the properties and effects of the present invention.

The temperature at which the thermotropic liquid crystal of the present invention starts to show liquid crystal state when it is molten (hereinafter referred to as "liquid crystal starting temperature") is preferably 150-350° C., more preferably 180-320° C. When the liquid crystal starting temperature is in the above range, the resulting resin compositions have preferable color and well-balanced heat resistance and moldability.

The apparent melt viscosity of the termotropic liquid crystals suitably used in the present invention (shear rate of 100/sec at the liquid crystal starting temperature +30° C.) is not particularly specified as far as the effects of the present invention can be obtained. The melt viscosity especially when fluidity is necessary is preferably 10-3,000 Pa·s, more preferably 10-2,000 Pa·s, especially preferably 10-1,000 Pa·s.

(C-5) Polyphenylene Sulfide Resin:

The polyphenylene sulfide resins suitably usable in the present invention are not particularly limited and conventionally known ones can be widely used as far as they can exert the effects of the present invention. For example, there may be used polyphenylene sulfide, polyphenylene sulfide ketone, polybiphenylene sulfide, polyphenylene sulfide sulfone, etc., and the polyphenylene sulfide is especially suitable.

The polyphenylene sulfides suitably used in the present invention can be optionally chosen from those which have a melt viscosity (shear rate 1,000/sec) of 100-10,000 poises at 300° C. They may have either of chain structure and branched structure, and particularly those of straight-chain structure can be suitably used.

Furthermore, the polyphenylene sulfides preferably have —SX groups (S is a sulfur atom and X is an alkali metal or a hydrogen atom) in an amount of 15 µmol/g or more, preferably 18-35 µmol/g, especially preferably 20-30 µmol/g based on the weight of the polyphenylene sulfides.

Methods for producing the polyphenylene sulfide suitably used in the present invention are, typically, a method of polymerizing a halogen-substituted aromatic compound such as p-dichlorobenzene in the presence of both sulfur and sodium carbonate; a method of carrying out polymerization in the presence of both sodium sulfide or sodium hydrogensulfide and sodium hydroxide or both hydrogen sulfide and sodium hydroxide or sodium aminoalkanoate in a polar solvent; a method of self-condensation of p-chlorothiophenol, and the like. Of these methods, suitable is a method of reacting sodium sulfide with p-dichlorobenzene in an amide solvent such as N-methylpyrrolidone or dimethylacetamide or sulfone solvent such as sulfolane.

The polyphenylene sulfides are not particularly limited as far as they are obtained by known methods. For example, the polyphenylene sulfides can be obtained by the methods disclosed in U.S. Pat. No. 2,513,188, JP-B-44-27671, JP-B-45-3368, JP-B-52-12240, JP-A-61-225217, U.S. Pat. No. 3,274,165, JP-B-46-27255, Belgian Patent No.29437, JP-A-5-222196, etc.

(C-6) Phenolic Resin:

As the phenolic resins in the present invention, there can be suitably used conventionally known ones. They include, for example, resol-type phenolic resins obtained by addition and condensation of phenol and aldehyde with a basic catalyst, novolak-type phenolic resins obtained by addition and condensation of phenol and aldehyde with an acid catalyst, and the like. Of these, the novolak-type phenolic resins can be suitably used. These phenolic resins may be used each alone or in combination of two or more.

The number average molecular weight of the phenolic resins used in the present invention is not particularly limited, and is suitably 300-50000. Phenolic resins differing in molecular weight may be used in combination.

(Blending Ratio of the Components in the Flame Retardant Composition)

The blending ratio of the components in the flame retardant composition is not particularly specified as far as the effects of the present invention can be obtained. When the effects of the present invention should be efficiently obtained, the blending ratio of the component (A) and the component (B) is such that the amount of the component (A) is 0.1-60 parts by weight and that of the component (B) is 99.9-40 parts by weight, preferably the amount of the component (A) is 0.1-50 parts by weight and that of the component (B) is 99.9-50 parts by weight in 100 parts by weight of the component (A) and the component (B) in total. In the case of adding only the component (A-2) as the component (A), more preferably the amount of the component (A-2) is 0.1-37 parts by weight and that of the component (B) is 99.9-63 parts by weight.

The blending ratio when the aromatic resin of the component (C) is added is such that the weight ratio of the component (C) and the component (B) is (C)/(B)=95/5-5/95, especially preferably (C)/(B)=90/10 10/90.

(Uses of Flame Retardant Composition)

The flame retardant compositions of the present invention can be widely suitably used, and method of use and field of use are not particularly specified. For example, they can be suitably used for flame retardants for resins, rubbers, lubricants, lithium ion batteries, solar batteries, fuel cells, non-flammable electrolytes, battery applications, releasing agents, releasing films, roughened surface forming materials, water repellants, etc.

Furthermore, when the component (C) is added as a flame retardation assistant, the flame retardant composition can be used as the resin composition, which can be suitably used for electric and electronic uses, industrial machines, residential equipments, aircraft parts, automobile parts, housings, etc.

(Form of Flame Retardant Composition)

The form of the flame retardant composition in the present invention is not particularly specified as far as the effects of the present invention can be obtained. For example, it is supplied in the form of powder, tablet, pellet, mass, wax, liquid, oil, or the like. If necessary, the flame retardant composition may be gasified for use. Furthermore, in the flame retardant composition of the present invention, the respective components may be completely compatibilized or may be simply mixed without complete compatibilization. Alternatively, it may be a mixture of the compositions in which the components are compatibilized and in which the components are simply mixed.

(Combination of Flame Retardant Composition and Resin)

The flame retardant composition of the present invention can be combined with known resins to prepare flame retardant resin compositions. The resins used for preparation of flame retardant resin compositions are not specified and known hardening resins and thermoplastic resins can be suitably used. For example, as the thermoplastic resins, mention may be made of polycarbonate resins, polyphenylene ether resins, polyphenylene sulfide resins, polypropylene resins, polyethylene resins, polystyrene resins, high-impact polystyrenes, elastomer-containing polystyrenes, syndiotactic polystyrene resins, ABS resins, AS resins, biodegradable resins, alloys of polycarbonate-ABS resins, polyalkylene terephthalate resins such as polybutylene terephthalate, polyethylene terephthalate, polypropylene terephthalate and polytrimethylene terephthalate, polyamide resins, thermotropic liquid crystals, etc. Especially suitable are polyphenylene ether resins, polystyrene resins, ABS resins, polyketone resins, alloys of polyphenylene ether and polystyrene, alloys of polyphenylene ether and polyamide, alloys of polyphenylene ether and thermotropic liquid crystal, and alloys of polyphenylene ether and polyphenylene sulfide.

As examples of the hardening resins used for the flame retardant resin compositions, mention may be made of unsaturated polyester resins, vinyl ester resins, diallyl phthalate resins, epoxy resins, cyanate resins, xylene resins, triazine resins, phenolic resins, urea resins, melamine resins, benzoguanamine resins, urethane resins, oxetane resins, ketone resins, alkyd resins, furan resins, styrylpyridine resins, silicon resins, synthetic rubbers, etc. Epoxy resins are especially suitable.

The resins used in the present invention may be used each alone or in combination of two or more.

When the flame retardant composition and the resin are combined and the resulting mixture is used as the flame retardant resin composition, and when the component (C) is added as one component of the flame retardant composition, the resin used is one which is different from the resin added as the component (C).

(Blending Ratio of the Components in the Flame Retardant Resin Composition)

The blending ratio of the flame retardant composition and the resin in the flame retardant resin composition of the present invention is not particularly specified as far as the effects of the present invention can be obtained. For example, the amount of the flame retardant composition (b) is preferably 1-1000 parts by weight based on 100 parts by weight of the resin component (a). The amount of the component (b) is more preferably 1-500 parts by weight, further preferably 3-400 parts by weight based on 100 parts by weight of the component (a).

(Additives)

Conventionally known non-halogen or non-antimony flame retardants can be used in combination with the flame retardant composition and flame retardant resin composition of the present invention. Examples of these flame retardants are phosphate esters such as trimethyl phosphate, triethyl phosphate, triphenyl phosphate, tricresyl phosphate, trixylenyl phosphate, phenylcresyl phosphate, phenylxylenyl phosphate, cresylxylenyl phosphate, resorcinolphenyl phosphate, and hydroquinonephenyl phosphate; condensed phosphate esters such as bisphenol A bis(diphenyl phosphate), bisphenol A bis(dicresyl phosphate), bisphenol S bis(diphenyl phosphate), resorcinol bis(diphenyl phosphate), resorcinol bis(dixylenyl phosphate), hydroquinone bis(diphenyl phosphate), and hydroquinone bis(dixylenyl phosphate); oxides or sulfides of tertiary phosphines such as triarylphosphines, trialkylphosphines, bis(diarylphosphino)benzenes and tris(diarylphosphino)benzenes; metal salts, amide salts, ammonium salts, melamine salts of phosphinic acid or phosphonic acid; metal hydroxides such as magnesium hydroxide, aluminum hydroxide, calcium hydroxide and calcium aluminate; melamine, melam, melem, mellon, methylene dimelamine, ethylene dimelamine, decamethylene dimelamine, 1,3-cyclohexyl dimelamine, 4,4'-diethylene dimelamine, diethylene trimelamine, benzoguanamine, dibenzoguanamine, succinoguanamine, methylguanamine, acetoguanamine, melamine resin, etc.; cyanurates, sulfates, phosphates and borates of the above compounds; triazine compounds such as 2-dibutylamino-4,6-dimercapto-S-triazine, 2-N-phenylamino-4,6-dimercapto-S-triazine, 2,4,6-trimercapto-S-triazine, triallyl cyanurate and trimethallyl isocyanurate; boron-containing compounds such as boric acid and zinc borate compound; silicone-containing compounds such as polyorganosiloxane, silsesquioxane and silicon resins; and inorganic silicon compounds such as silica, kaolin clay, talc and wollastonite. The flame retardance can be further improved by adding these flame retardants.

Furthermore, conventionally known fillers can be added to the flame retardant compositions and flame retardant resin compositions of the present invention for the purpose of improving mechanical properties. Examples of the fillers are silica, kaolin clay, talc, wollastonite, titanium oxide, glass beads, glass flakes, glass fibers, calcium carbonate, barium carbonate, calcium sulfate, barium sulfate, calcium silicate, potassium titanate, aluminum borate, magnesium borate, fibrous reinforcing materials such as kenaf fibers, carbon fibers, silica fibers, alumina fibers and quartz fibers, and non-fibrous reinforcing materials. These may be coated with organic materials, inorganic materials, etc.

In using the flame retardant composition or the flame retardant resin composition containing the flame retardant composition of the present invention, so long as the effects of the present invention are not damaged, there may be previously added other additives to impart other properties such as stiffness and dimensional stability, and examples of the other additives are plasticizers, antioxidants, ultraviolet absorbers, stabilizers such as light stabilizers, hardening agents, hardening accelerators, antistatic agents, electrical conductivity-imparting agents, stress relaxing agents, releasing agents, crystallization accelerators, hydrolysis inhibitors, lubricants, impact imparting agents, slidability imparting agents, compatibilizing agents, nucleating agents, strengthening agents, reinforcing agents, fluidity adjusting agents, dyes, sensitizers, coloring pigments, rubber-like polymers, electroconductive polymers, etc.

(Sequence of Addition of the Components in the Flame Retardant Composition)

The method of addition of the respective components in the flame retardant composition of the present invention is not particularly specified as far as the effects of the present invention can be obtained. The component (A) and the component (B) and, if necessary, the component (C) may be previously mixed or the component (A) and the component (B) are mixed and thereafter the component (C) may be added.

(Method for Blending of the Flame Retardant Composition and the Resin)

Method for blending of the flame retardant composition and the thermoplastic resin in the present invention is not particularly limited as far as the effects of the present invention can be obtained. For example, they can be kneaded using kneading machines such as extruder, heating roll, kneader and Banbury mixer. Among them, melt kneading by an extruder is preferred from the point of productivity. The melt kneading temperature may be according to the preferred processing temperature of the base resin, and may be, for example, in the range of 140-360° C., preferably 180-320° C.

The molded articles of the flame retardant composition (containing the component (C)) or the flame retardant resin composition of the present invention can be produced by known methods such as injection molding, sheet molding, blow molding, injection blow molding, inflation molding, extrusion molding, foam molding and film molding. Moreover, there may be employed post-forming methods such as pressure forming and vacuum forming.

When the flame retardant composition of the present invention is blended with a hardening resin, there may also be employed a method according to which the components for producing the resin composition are mixed in the solvent-free state or, if necessary, using a solvent in which the components can be uniformly mixed, then the solvent is removed to obtain a resin mixture, and this mixture is cast in a mold and hardened and then cooled, and is removed from the mold to obtain a molded article. Alternatively, the mixture can be cast in a mold and hardened by a hot press. The solvent for dissolving the components is not particularly limited so long as the various materials can be uniformly mixed and the effects of the present invention are not damaged by using the solvent. The solvents include, for example, toluene, xylene, acetone, methyl ethyl ketone, diethyl ketone, cyclopentanone, cyclohexanone, dimethylformamide, methyl cellosolve, methanol, ethanol, n-propanol, iso-propanol, n-butanol, n-pentanol, n-hexanol, cyclohexanol, n-hexane, n-pentane, etc.

Furthermore, mention may be made of one example of the method which comprises producing the composition by kneading using a kneading machine such as heating roll, kneader, Banbury mixer or extruder, then cooling and grinding the composition, and subjecting it to transfer molding, injection molding, compression molding, or the like. The hardening method is not particularly limited though it depends on the hardening agent used. Examples of the hardening method are heat hardening, photo-hardening, UV hardening, hardening with pressure, hardening with moisture, etc., and the method is not specified as far as the effects of the present invention can be obtained. The sequence of mixing of the components is not particularly specified as far as the effects of the present invention can be obtained. Preferred methods for producing the resin composition can be used depending on the suitability of the respective resins.

(Blending Ratio of the Flame Retardant Composition and the Resin)

The ratio of the flame retardant composition and the resin which are combined to obtain the flame retardant resin composition cannot be simply determined because of the difference in flame retardance of every resin used. The phosphorus concentration in the flame retardant resin composition is preferably 0.3% by weight or higher in the case of using polyphenylene ether resin or polycarbonate resin which can be readily flame retarded, and is preferably 0.5% by weight or higher in the case of using flammable polystyrene, polybutadiene, styrene-copolymerized elastomer, ABS resin, epoxy resin, phenolic resin, or the like. In a case where the flame retardance cannot be imparted only unless the phosphorus concentration is 5% by weight or higher, the proportion of the flame retardant composition in the flame retardant resin composition is too high, which is unreal and besides not preferred because the flame retardant composition sometimes bleeds to the surface of resin.

(Use of the Flame Retardant Resin Composition)

The flame retardant resin composition using the flame retardant composition of the present invention can be suitably used for electric and electronic equipment parts such as coil bobbins, flyback transformer, connectors and deflecting yoke; electric and electronic materials such as printed wiring boards, printed circuit boards, sealers, electric insulating materials, electric coating agents, laminate sheets, varnish for high-speed operation, advanced composite materials, electric wires, aerial materials, cables and high-performance molding materials; paints, adhesives, coating materials, tableware, buttons, fiber and paper treating agents, decorative sheets, UV hardening type inks, sealants, synthetic leathers, heat insulating cushioning materials, coating film waterproofing materials, corrosion-resistant linings, binders for molds, lacquers, paints, ink modifying agents, resin modifying materials, aircraft interior parts, matrixes for composite materials, utensils, OA equipments, AV equipments, battery applications, lighting units, automobile parts, housings, ETC, ITC, portable telephones, etc.

EXAMPLES

The present invention will be specifically explained by the following examples, which should not be construed as limiting the invention in any manner.

First, methods for evaluation of various properties will be explained.

1) Flame Retardance

Based on the UL-94 vertical burning test, the flame retardance was measured. That is, an injection molded test piece of about 1.6 mm or 3.2 mm thick or a hardened test piece of 2 mm thick was used, and when the test piece was allowed to contact with flame ten times, an average burning time was determined, and it was evaluated whether an absorbent cotton caught fire due to drips at the time of burning.

2) Smoke Emission at the Time of Burning

The UL-94 vertical burning test was conducted using a UL burning test chamber (HVUL-C manufactured by Toyo Seiki Seisaku-sho, Ltd.). Evaluation was visually conducted, and the results were graded as "O" when the smoke emitted at the time of the burning test hardly leaked out of the chamber, as "Δ" when a small amount of the smoke leaked out, and as "x" when a large amount of the smoke leaked out.

3) TGA (Thermogravimetric Analysis)

About 10 mg of a sample was heated to 600° C. at a rate of 10° C./min in 30 ml/min of nitrogen stream using Thermal Analysis System 7 Series manufactured by Perkin Elmer Co., Ltd., and the difference between the temperature at which weight reduction of 5% occurred and the temperature at which weight reduction of 50% occurred was determined.

4) Measurement of Water Content

The water content was measured by Karl Fischer's method at a preset temperature of 150° C.

5) Thermal Stability (Occurrence of Mold Deposits: MD)

Using an injection molding machine set at a cylinder temperature of 260° C. and a mold temperature of 60° C., a test piece of 128 mm in length×12.8 mm in width×1.6 mm in thickness was molded, and after carrying out 20 shots, the state of the mold surface was visually observed.

O: MD occurred very little.

x: MD occurred much.

6) Heat Resistance (DTUL (Deflection Temperature Under Load))—Thermoplastic Resin In accordance with the method of ASTM-D-648, heat resistance (DTUL) of a test piece of 6.4 mm thick was measured under a load of 18.6 kg.

7) Heat Resistance (DTUL)—Hardening Resin

In accordance with the method of ASTM-D-648, heat resistance (DTUL) of a test piece of 2 mm thick was measured under a load of 4.6 kg.

8) Dielectric Properties

Using a molded piece of about 2 mm thick (Table 4) or about 2.5 mm thick (Tables 16, 17 and 20), relative dielectric constant and relative dielectric loss tangent were measured at a frequency of 1 GHz by capacitance method.

9) Notched Izod Impact Strength

The notched Izod impact strength was measured using a test piece of 6.4 mm thick by the method of ASTM-D-256.

10) Releasability

A dumbbell test piece of ASTM-D-638 was molded by injection molding at the following preset temperature, and degree of releasability of the test piece and runner from the mold was visually judged. Good releasability is indicated by "O", and bad releasability is indicated by "x".

Examples 40-42 and Comparative Examples 20-23: barrel temperature 220° C. and mold temperature 60° C.

Example 67 and Comparative Examples 42 and 43: barrel temperature 280° C. and mold temperature 80° C.

Example 68 and Comparative Example 44: barrel temperature 280° C. and mold temperature 90° C.

Example 69: barrel temperature 320° C. and mold temperature 90° C.

11) Extrudability

Melt mixing was carried out by a twin-screw extruder of 25 mm in screw diameter at a screw revolution speed of 300 rpm with setting the maximum temperature of the heating cylinder at the following temperatures.

Examples 40-48, 50 and 53 and Comparative Examples 20-27—220° C.

Examples 49, 51, 52 and 54-66 and Comparative Examples 28-41—300° C.

Example 67 and Comparative Examples 42-43—280° C.

Example 68 and Comparative Example 44—260° C.

Example 69—325° C.

Examples 70-72 and Comparative Example 45-50—260° C.

The extrudability was visually judged. That is, during melt kneading for 10 minutes, when the strands cut twice or more, this is indicated by "x", when the strands cut once, this is indicated by "Δ", and when the strands did not cut at all, this is indicated by "O".

12) Moisture Absorption Resistance

A molded piece of about 2 mm thick was moistened in a thermo-hygrostat under the conditions of preset temperature of 85° C. and a relative humidity of 95% RH for 64 hours, and the difference in weight before and after moistening was measured. When the value obtained by dividing the difference between the weight after moistening and the weight before the moistening by the weight before moistening and multiplying the resulting quotient by 100 was not more than 2%, this is indicated by "O", when the resulting value was 2-2.4%, this is indicated by "Δ", and when the resulting value was more than 2.4%, this is indicated by "x". The results are used as indications of moisture absorption resistance.

The components used in Examples and Comparative Examples are shown below.

(A-1) Metal Oxides (M-1)

Nickel oxide (NiO; manufactured by Wako Pure Chemical Industries, Ltd.)

(M-2)

Palladium oxide (PdO; manufactured by Wako Pure Chemical Industries, Ltd.)

(M-3)

Niobium oxide ($Nb_2O_5$; manufactured by Wako Pure Chemical Industries, Ltd.)

(M-4)

Zinc oxide (ZnO; manufactured by Wako Pure Chemical Industries, Ltd.)

(M-5)

Ferrocene (manufactured by Wako Pure Chemical Industries, Ltd.)

(M-6)

Iron oxide ($Fe_2O_3$; manufactured by Wako Pure Chemical Industries, Ltd.)

(M-7)

Polyorganosiloxane (SH710; manufactured by Shin-Etsu Chemical Co., Ltd.)

(M-8)

Magnesium hydroxide ($Mg(OH)_2$; manufactured by Wako Pure Chemical Industries, Ltd.)

(M-9)

Iron oxide (TIC-8048D; manufactured by Toda Kogyo Co., Ltd.)

(M-10)

Molybdenum oxide ($MoO_3$; manufactured by Wako Pure Chemical Industries, Ltd.)

(M-11)

Vanadium oxide ($V_2O_5$; manufactured by Wako Pure Chemical Industries, Ltd.)

(M-12)

Triiron tetroxide ($Fe_3O_4$; manufactured by Wako Pure Chemical Industries, Ltd.)

(M-13)

Cupric oxide (CuO; manufactured by Wako Pure Chemical Industries, Ltd.)

(M-14)

Cuprous oxide ($Cu_2O$; manufactured by Wako Pure Chemical Industries, Ltd.)

(A-2) Trivalent Phosphorus Compounds (P-1)

Triphenylphosphine (manufactured by Wako Pure Chemical Industries, Ltd.)

(P-2)

Tris(m-methylphenyl)phosphine (manufactured by Wako Pure Chemical Industries, Ltd.)

(P-3)

Tris(o-methylphenyl)phosphine obtained by the reaction of phosphorus trichloride with 2-methylphenylmagnesium bromide (TolMgBr) prepared from 1-bromo-2-methylbenzene (TolBr) and metallic magnesium.

(P-4)

Trimesitylphosphine ($Mes_3P$) obtained by the reaction of phosphorus trichloride with mesitylmagnesium bromide (MesMgBr) prepared from 1-bromo-2,4,6-trimethylbenzene (MesBr) and magnesium.

(B) Phosphazene Compounds (FR-1)

Phenoxyphosphazene comprising 93.6% by weight of a phenoxyphosphazene represented by the following formula (14) in which n is 3, 4.0% by weight of a phenoxyphosphazene represented by the formula (14) in which n is 4, and 2.4% by weight of a phenoxyphosphazene represented by the formula (14) in which n is 5 or more (5% weight reduction temperature: 336° C.; 50% weight reduction temperature: 398° C.; residue at 500° C.: 4.7% by weight; acid value: 0.17; water content: 182 ppm)

(FR-2)

Phenoxyphosphazene comprising 88.7% by weight of a phenoxyphosphazene represented by the following formula

(14) in which n is 3, 6.2% by weight of a phenoxyphosphazene represented by the formula (14) in which n is 4, and 5.1% by weight of a phenoxyphosphazene represented by the formula (14) in which n is 5 or more (5% weight reduction temperature: 339° C.; 50% weight reduction temperature: 404° C.; residue at 500° C.: 8.7% by weight; acid value: 0.22; water content: 225 ppm)

(FR-3)

Phenoxyphosphazene comprising 85.3% by weight of a phenoxyphosphazene represented by the following formula (14) in which n is 3, 9.3% by weight of a phenoxyphosphazene represented by the formula (14) in which n is 4, and 5.4% by weight of a phenoxyphosphazene represented by the formula (14) in which n is 5 or more (5% weight reduction temperature: 318° C.; 50% weight reduction temperature: 421° C.; residue at 500° C.: 14.2% by weight; acid value: 1.04; water content: 1100 ppm)

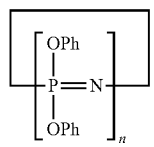

(14)

(FR-4)

Xylenoxyphosphazene comprising 99.3% by weight of a xylenoxyphosphazene represented by the following formula (15) in which n is 3 and 0.7% by weight of a xylenoxyphosphazene represented by the formula (15) in which n is 4 (5% weight reduction temperature: 349° C.; 50% weight reduction temperature: 418° C.; residue at 500° C.: 11.0% by weight; acid value: 0.23; water content: 137 ppm)

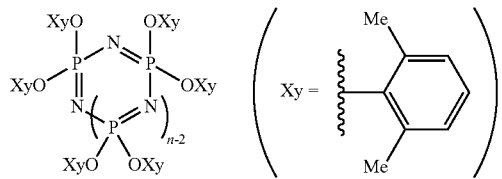

(15)

(Resins and Other Components)

(1) Polyphenylene Ether Resins (PPE-1)

Poly-2,6-dimethyl-1,4-phenylene ether having a number average molecular weight (calculated in terms of polystyrene) of 2600 measured by GPC.

(PPE-2)

Poly-2,6-dimethyl-1,4-phenylene ether having a number average molecular weight (calculated in terms of polystyrene) of 2100 measured by GPC.

(PPE-3)

Poly-2,6-dimethyl-1,4-phenylene ether having a number average molecular weight (calculated in terms of polystyrene) of 3600 measured by GPC.

(PPE-4)

This was obtained by sufficiently mixing 500 g of polyphenylene ether: PPE-1 functionalized with epoxy group, 200 g of AER250 and 15 g of tri-n-butylamine (manufactured by Wako Pure Chemical Industries, Ltd.), then enclosing the mixture in an autoclave and heating it at 130° C. for 1 hour.

(PPE-5)

Poly-2,6-dimethyl-1,4-phenylene ether having a η sp/c of 0.54 measured in a chloroform solution at 30° C.

(PPE-6)

Maleic anhydride-modified PPE pellets were obtained by adding 0.5 part by weight of maleic anhydride to 100 parts by weight of poly(2,6-dimethyl-1,4-phenylene ether) having a η sp/c of 0.41 measured in a chloroform solution at 30° C., kneading and extruding the mixture by a twin-screw extruder at 330° C. and 300 RPM.

(2) Polycarbonate Resin (PC)

PANLITE L-1250Y (manufactured by Teijin Chemicals Ltd.; Non-flame retardant transparent grade (3) Polyamide Resin (PA66)

LEONA1300S (manufactured by Asahi Kasei Chemicals Corporation)

(PA66/6I)

Polyamide 66/6I resin obtained by polymerization using hexamethylenediamine and 18 parts by weight of adipic acid and 82 parts by weight of isophthalic acid based on 100 parts by weight of adipic acid and isophthalic acid in total.

(PA6I/6T)

Polyamide 6I/6T resin obtained by polymerization using hexamethylenediamine and 70 parts by weight of isophthalic acid and 30 parts by weight of terephthalic acid based on 100 parts by weight of isophthalic acid and terephthalic acid in total.

(4) Bisphenol A Type Epoxy Resin ("Epoxy" in the Tables)

AER250 (manufactured by Asahi Kasei Epoxy Co., Ltd.); Epoxy equivalent: 184-186

(5) Rubber-Reinforced Polystyrene (HIPS)

Rubber-reinforced polystyrene in which rubber content is 9%, η sp/c of the matrix polystyrene is 0.64 measured at 30° C. in a toluene solution and volume average rubber particle diameter is 1.5 μm.

(6) Polystyrene (GPPS)

Polystyrene having a η sp/c of 0.8 measured in a toluene solution.

(7) Acrylonitrile-Butadiene-Styrene Resin (ABS)

STYRAC ABS (manufactured by Asahi Kasei Corporation)

(8) Hardener m-Xylene-α,α'-diamine (manufactured by Wako Pure Chemical Industries, Ltd.)

(9) Melamine Cyanurate

MC C—O (manufactured by Mitsubishi Chemical Co., Ltd.)

(10) PTFE

PTFE 6C-J (manufactured by Du Pont-Mitsui Fluorochemicals Company, Ltd.)

Examples 1-3 and 23-24, Comparative Examples 1-4 and 14-15

The epoxy resin and the component (A) in the amounts shown in Table 1 and Table 7 were mixed in an oil bath set at 130° C., and then the component (B) and, if necessary, melamine cyanurate were mixed in the oil bath set at 130° C. While keeping the temperature, mXDA was added thereto and then the mixture was cast into a mold.

Then, test pieces were molded by hardening each of the compositions for 2 minutes at 100° C. and 0 kgf/cm², for 2 minutes at 100° C. and 10 kgf/cm², and for 12 minutes at 100° C. and 40 kgf/cm² by a hot press. The properties of the test pieces were evaluated to obtain the results as shown in Table 1 and Table 7.

Examples 4-22 and 25-39, Comparative Examples 5-13 and 16-19

The epoxy resin and PPE in the amounts as shown in Tables 2-6 and Tables 8-11 were dissolved, in an oil bath set at 140° C., and then the phosphazene compound was dissolved in the solution in the oil bath set at 130° C., followed by mixing with the component (A). While keeping the temperature, mXDA was added thereto and then the mixture was cast into a mold.

Then, test pieces were molded by hardening each of the compositions for 2 minutes at 100° C. and 0 kgf/cm², for 2 minutes at 100° C. and 10 kgf/cm², and for 12 minutes at 100° C. and 40 kgf/cm² by a hot press. The properties of the test pieces were evaluated to obtain the results as shown in Tables 2-6 and Tables 8-11.

TABLE 3

|  | Example 7 | Comparative Example 8 |
|---|---|---|
| (A) NiO/part by weight | 0.5 | 0.5 |
| (B) FR-1/part by weight | 8 | — |
| FR-3/part by weight | — | 8 |
| PPE-1/part by weight | 16.7 | 16.7 |
| Epoxy/part by weight | 51 | 51 |
| mXDA/part by weight | 9.2 | 9.2 |
| [UL-94] 2 mm | V-0 | V-1 |
| Average burning time/sec | 4 | 7.7 |
| Maximum burning time/sec | 9.7 | 18.2 |
| Smoke emission at burning | ○ | X |
| DTUL/° C. | 85 | 84 |
| Moisture absorption resistance | ○ | Δ |

TABLE 1

|  | Example 1 | Example 2 | Example 3 | Comparative Example 1 | Comparative Example 2 | Comparative Example 3 | Comparative Example 4 |
|---|---|---|---|---|---|---|---|
| (A) NiO/part by weight | 4 | — | — | — | — | 4 | — |
| CuO/part by weight | — | 4 | 3 | — | — | — | 4 |
| Mg(OH)₂/part by weight | — | — | — | — | 4 | — | — |
| (B) FR-1/part by weight | 20 | — | — | 20 | 20 | — | — |
| FR-2/part by weight | — | 20 | 20 | — | — | — | — |
| FR-3/part by weight | — | — | — | — | — | 20 | 20 |
| Epoxy/part by weight | 51 | 51 | 51 | 51 | 51 | 51 | 51 |
| mXDA/part by weight | 9.2 | 9.2 | 9.2 | 9.2 | 9.2 | 9.2 | 9.2 |
| Melamine cyanurate/part by weight | — | — | 2 | — | — | — | — |
| [UL-94] 2 mm | V-2 | V-2 | V-2 | V out | V out | V out | V out |
| Smoke emission at burning | ○ | Δ | ○ | X | X | X | X |

TABLE 2

|  | Example 4 | Example 5 | Example 6 | Comparative Example 5 | Comparative Example 6 | Comparative Example 7 |
|---|---|---|---|---|---|---|
| (A) NiO/part by weight | 2.0 | — | — | — | — | — |
| PdO/part by weight | — | 2.0 | — | — | — | — |
| Nb₂O₅/part by weight | — | — | 2.0 | — | — | — |
| ZnO/part by weight | — | — | — | 2.0 | — | — |
| Ferrocene/part by weight | — | — | — | — | 2.0 | — |
| Mg(OH)₂/part by weight | — | — | — | — | — | 2.0 |
| (B) FR-1/part by weight | 8.0 | 8.0 | 9.0 | 9.0 | 9.0 | 9.0 |
| PPE-1/part by weight | 16.7 | 16.7 | 16.7 | 16.7 | 16.7 | 16.7 |
| Epoxy/part by weight | 51.0 | 51.0 | 51.0 | 51.0 | 51.0 | 51.0 |
| mXDA/part by weight | 9.2 | 9.2 | 9.2 | 9.2 | 9.2 | 9.2 |
| [UL-94] 2 mm | V-0 | V-0 | V-0 | V-1 | V out | V-1 |
| Average burning time/sec | 3.0 | 3.2 | 4.9 | 8.2 | 13.8 | 7.8 |
| Maximum burning time/sec | 8.1 | 6.9 | 9.8 | 14.0 | 32.7 | 18.3 |
| Smoke emission at burning | ○ | ○ | ○ | ○ | X | X |
| DTUL/° C. | 84.0 | 84.0 | 82.0 | 81.0 | 80.0 | 81.0 |
| Moisture absorption resistance | ○ | ○ | ○ | ○ | ○ | X |

TABLE 4

|  |  | Example 8 | Example 9 | Example 10 | Comparative Example 9 | Comparative Example 10 | Comparative Example 11 |
|---|---|---|---|---|---|---|---|
| (A) | $Cu_2O$/part by weight | 2 | — | — | — | — | — |
|  | CuO/part by weight | — | 1 | 2 | 1 | — | — |
| (B) | FR-2/part by weight | 10 | 8 | 8 | — | 8 | — |
|  | FR-3/part by weight | — | — | — | 8 | — | 8 |
|  | PPE-1/part by weight | 16.7 | 16.7 | 16.7 | 16.7 | 16.7 | 16.7 |
|  | Epoxy/part by weight | 51 | 51 | 51 | 51 | 51 | 51 |
|  | mXDA/part by weight | 9.2 | 9.2 | 9.2 | 9.2 | 9.2 | 9.2 |
|  | [UL-94] 2 mm | V-0 | V-0 | V-0 | V-1 | V-1 | V out |
|  | Average burning time/sec | 4.8 | 3.7 | 3.3 | 6.5 | 8.3 | 9.5 |
|  | Maximum burning time/sec | 8.9 | 9.8 | 8.3 | 15.2 | 25.5 | 31.2 |
|  | Smoke emission at burning | ○ | ○ | ○ | X | Δ | X |
|  | DTUL/° C. | 82 | 85 | 85 | 83 | 83 | 83 |
|  | Moisture absorption resistance | ○ | ○ | ○ | Δ | ○ | Δ |
|  | Relative dielectric constant [1 GHz] | — | — | 3.04 | — | 3.12 | — |
|  | Relative dielectric loss tangent [1 GHz] | — | — | 0.0184 | — | 0.0186 | — |

TABLE 5

|  |  | Example 11 | Example 12 | Example 13 | Example 14 | Example 15 | Example 16 | Comparative Example 12 |
|---|---|---|---|---|---|---|---|---|
| (A) | NiO/part by weight | 0.1 | 0.5 | 1.0 | 2.0 | 4.0 | 2.0 | 0.5 |
| (B) | FR-1/part by weight | 8.0 | 8.0 | 8.0 | 8.0 | 8.0 | 6.0 | — |
|  | FR-3/part by weight | — | — | — | — | — | — | 8.0 |
|  | PPE-1/part by weight | 16.7 | 16.7 | 16.7 | 16.7 | 16.7 | 20.0 | 16.7 |
|  | Epoxy/part by weight | 51.0 | 51.0 | 51.0 | 51.0 | 51.0 | 47.0 | 51.0 |
|  | mXDA/part by weight | 9.2 | 9.2 | 9.2 | 9.2 | 9.2 | 8.5 | 9.2 |
|  | [UL-94] 2 mm | V-1 | V-0 | V-0 | V-0 | v-0 | V-0 | V-1 |
|  | Average buring time/sec | 4.5 | 4.0 | 3.3 | 3.0 | 2.2 | 4.5 | 7.7 |
|  | Maximum buring time/sec | 12.4 | 9.7 | 8.2 | 8.1 | 4.6 | 8.2 | 18.2 |
|  | Smoke emission at burning | ○ | ○ | ○ | ○ | ○ | ○ | X |
|  | Moisture absorption resistance | ○ | ○ | ○ | ○ | ○ | ○ | Δ |

TABLE 6

|  |  | Example 17 | Example 18 | Example 19 | Example 20 | Example 21 | Example 22 | Comparative Example 13 |
|---|---|---|---|---|---|---|---|---|
| (A) | NiO/part by weight | 2.0 | 2.0 | 2.0 | — | 2.0 | 3.5 | 3.5 |
|  | CuO/part by weight | — | — | — | 2.0 | — | — | — |
| (B) | FR-1/part by weight | 8.0 | 8.0 | 8.0 | — | — | 20.0 | — |
|  | FR-2/part by weight | — | — | — | 8.0 | — | — | — |
|  | FR-3/part by weight | — | — | — | — | — | — | 20.0 |
|  | FR-4/part by weight | — | — | — | — | 8.0 | — | — |
|  | PPE-1/part by weight | — | — | — | — | 16.7 | 10.0 | 10.0 |
|  | PPE-2/part by weight | 16.7 | — | — | — | — | — | — |
|  | PPE-3/part by weight | — | 16.7 | — | 16.7 | — | — | — |
|  | PPE-4/part by weight | — | — | 23.4 | — | — | — | — |
|  | Epoxy/part by weight | 51.0 | 51.0 | 36.4 | 51.0 | 51.0 | 90.0 | 90.0 |
|  | mXDA/part by weight | 9.2 | 9.2 | 9.2 | 9.2 | 9.2 | 16.2 | 16.2 |
|  | [UL-94] 2 mm | V-0 | V-0 | V-0 | V-0 | V-0 | V-0 | V out |
|  | Average burning time/sec | 3.5 | 2.9 | 3.3 | 3.6 | 4.3 | 4.9 | 10.1 |
|  | Maximum burning time/sec | 9.1 | 4.7 | 7.7 | 6.3 | 6.9 | 9.9 | 31.2 |
|  | Smoke emission at burning | ○ | ○ | ○ | ○ | ○ | ○ | X |
|  | Moisture absorption resistance | ○ | ○ | ○ | ○ | ○ | Δ | X |

TABLE 7

|  | Example 23 | Example 24 | Comparative Example 14 | Comparative Example 15 |
|---|---|---|---|---|
| (A) P-1/part by weight | 10 | — | 10 | — |
| P-3/part by weight | — | 10 | — | — |
| (B) FR-1/part by weight | 20 | 20 | — | 20 |
| FR-3/part by weight | — | — | 20 | — |
| Epoxy/part by weight | 51 | 51 | 51 | 51 |
| mXDA/part by weight | 9.2 | 9.2 | 9.2 | 9.2 |
| [UL-94] 2 mm | V-2 | V-2 | V out | V out |
| Smoke emission at burning | Δ | Δ | X | X |

TABLE 8

|  | Example 25 | Comparative Example 16 | Comparative Example 17 | Comparative Example 18 |
|---|---|---|---|---|
| (A) P-1/part by weight | 2 | 2 | — | 8 |
| (B) FR-1/part by weight | 8 | — | 8 | — |
| FR-3/part by weight | — | 8 | — | — |
| PPE-1/part by weight | 16.7 | 16.7 | 16.7 | 16.7 |
| Epoxy/part by weight | 51 | 51 | 51 | 51 |
| mXDA/part by weight | 9.2 | 9.2 | 9.2 | 9.2 |
| [UL-94] 2 mm | V-0 | V out | V-1 | V-1 |
| Average buring time/sec | 3.6 | 9.4 | 8.8 | 9.9 |
| Maximum buring time/sec | 9.4 | 32.6 | 25.9 | 20.2 |
| Smoke emission at burning | ○ | X | ○ | X |
| Moisture absorption resistance | ○ | X | ○ | Δ |

TABLE 9

|  | Example 26 | Example 27 | Example 28 | Example 29 |
|---|---|---|---|---|
| (A) P-1/part by weight | 2 | — | — | — |
| P-2/part by weight | — | 2 | — | — |
| P-3/part by weight | — | — | 2 | — |
| P-4/part by weight | — | — | — | 1 |
| (B) FR-1/part by weight | 8 | 8 | 8 | 8 |
| PPE-1/part by weight | 16.7 | 16.7 | 16.7 | 16.7 |
| Epoxy/part by weight | 51 | 51 | 51 | 51 |
| mXDA/part by weight | 9.2 | 9.2 | 9.2 | 9.2 |
| [UL-94] 2 mm | V-0 | V-0 | V-0 | V-0 |
| Average burning time/sec | 3.6 | 3.2 | 3.2 | 3.7 |
| Maximum burning time/sec | 9.4 | 7 | 7.3 | 8.1 |
| Smoke emission at burning | ○ | ○ | ○ | ○ |
| Moisture absorption resistance | ○ | ○ | ○ | ○ |

TABLE 10

|  | Example 30 | Example 31 | Example 32 | Example 33 | Example 34 |
|---|---|---|---|---|---|
| P-1/part by weight | 0.1 | 0.5 | 1 | 4 | 2 |
| FR-1/part by weight | 8 | 8 | 8 | 8 | 6 |
| PPE-1/part by weight | 20 | 16.7 | 16.7 | 16.7 | 16.7 |
| Epoxy/part by weight | 47 | 51 | 51 | 51 | 51 |
| mXDA/part by weight | 8.5 | 9.2 | 9.2 | 9.2 | 9.2 |
| [UL-94] 2 mm | V-0 | V-0 | V-0 | V-0 | V-0 |
| Average burnin time/sec | 4.8 | 4.6 | 4.5 | 3.1 | 4.7 |
| Maximum burning time/sec | 9.2 | 9.4 | 9.9 | 8.2 | 8.6 |
| Smoke emission at burning | ○ | ○ | ○ | ○ | ○ |

TABLE 11

|  | Example 35 | Example 36 | Example 37 | Comparative Example 19 | Example 38 | Example 39 |
|---|---|---|---|---|---|---|
| (A) P-1/part by weight | 2 | 2 | 2 | 2 | 2 | 2 |
| (B) FR-1/part by weight | 8 | 8 | 8 | — | — | — |
| FR-3/part by weight | — | — | — | 8 | — | — |
| FR-4/part by weight | — | — | — | — | 8 | 8 |
| PPE-1/part by weight | — | — | — | — | 16.7 | — |

TABLE 11-continued

|  | Example 35 | Example 36 | Example 37 | Comparative Example 19 | Example 38 | Example 39 |
|---|---|---|---|---|---|---|
| PPE-2/part by weight | 16.7 | — | — | — | — | — |
| PPE-3/part by weight | — | 16.7 | — | 16.7 | — | — |
| PPE-4/part by weight | — | — | 23.4 | — | — | 23.4 |
| Epoxy/part by weight | 51 | 51 | 36.4 | 51 | 51 | 36.4 |
| mXDA/part by weight | 9.2 | 9.2 | 9.2 | 9.2 | 9.2 | 9.2 |
| [UL-94] 2 mm | V-0 | V-0 | V-0 | V-1 | V-0 | V-0 |
| Average burning time/sec | 3.8 | 3.5 | 3.5 | 8.3 | 4.3 | 4.2 |
| Maximum burning time/sec | 8.8 | 9.7 | 8.4 | 28.9 | 7.2 | 7.8 |
| Smoke emission at burning | ○ | ○ | ○ | X | ○ | ○ |

Examples 40-72 and Comparative Examples 20-50

The components were mixed at the ratio as shown in Tables 12-23, and the mixture was fed to a twin-screw extruder of 25 mm in screw diameter in which the maximum temperature of the heating cylinder was set at 200-330° C. to carry out melt mixing at a screw revolution speed of 300 rpm, and the resulting strands were cooled and cut to obtain resin composition pellets.

Then, the resulting resin composition pellets were molded by injection molding at 200-330° C. to obtain pieces for testing of physical properties, which were subjected to test of physical properties by the above-mentioned test methods to obtain the results of Tables 12-23.

TABLE 12

|  | Example 40 | Example 41 | Example 42 | Comparative Example 20 | Comparative Example 21 | Comparative Example 22 | Comparative Example 23 |
|---|---|---|---|---|---|---|---|
| (A) $Fe_3O_4$/part by weight | — | 3 | — | — | — | 3 | — |
| $Fe_2O_3$/part by weight | — | — | 3 | — | — | — | — |
| CuO/part by weight | 3 | — | — | — | 3 | — | — |
| $Mg(OH)_2$/part by weight | — | — | — | — | — | — | 3 |
| (B) FR-1/part by weight | 15 | 15 | 15 | 15 | — | — | 15 |
| FR-3/part by weight | — | — | — | — | 15 | 15 | — |
| PS/part by weight | 100 | 100 | 100 | 100 | 100 | 100 | 100 |
| [UL-94] 1.6 mm | V-2 | V-2 | V-2 | V out | V out | V out | V out |
| Smoke emission at burning | ○ | ○ | ○ | Δ | X | X | X |
| Releasability | ○ | ○ | ○ | ○ | X | X | ○ |
| Extrudability | ○ | ○ | ○ | ○ | X | X | ○ |

TABLE 13

|  | Example 43 | Example 44 | Example 45 | Comparative Example 24 | Comparative Example 25 | Comparative Example 26 |
|---|---|---|---|---|---|---|
| (A) $Fe_3O_4$/part by weight | — | 2 | — | — | — | 3 |
| $Fe_2O_3$/part by weight | — | — | 3 | — | — | — |
| CuO/part by weight | 3 | — | — | — | 3 | — |
| (B) FR-1/part by weight | 15 | 15 | 15 | 15 | — | — |
| FR-3/part by weight | — | — | — | — | 15 | 15 |
| HIPS/part by weight | 100 | 100 | 100 | 100 | 100 | 100 |
| [UL-94] 1.6 mm | V-2 | V-2 | V-2 | V out | V out | V out |
| Smoke emission at burning | ○ | ○ | ○ | Δ | X | X |
| Extrudability | ○ | ○ | ○ | ○ | X | X |

TABLE 14

|  | Example 46 | Example 47 | Example 48 | Comparative Example 27 | Example 49 |
|---|---|---|---|---|---|
| (A) P-1/part by weight | 5 | 5 | — | 5 | 3 |
| P-3/part by weight | — | — | 5 | — | — |
| (B) FR-1/part by weight | 15 | 15 | 15 | — | 10 |
| FR-2/part by weight | — | — | — | 15 | — |
| PPE-5/part by weight | — | — | — | — | 25 |
| HIPS/part by weight | 100 | — | 100 | 100 | 49 |
| PS/part by weight | — | 100 | — | — | 26 |
| [UL-94] 1.6 mm | V-2 | V-2 | V-2 | V out | V-2 |
| Smoke emission at burning | ○ | ○ | ○ | X | Δ |
| Extrudability | ○ | ○ | ○ | X | ○ |

TABLE 15

|  | Example 50 | Example 51 | Example 52 | Example 53 | Example 54 |
|---|---|---|---|---|---|
| (A) $Fe_3O_4$/part by weight | 3 | 1 | — | — | — |
| $Fe_2O_3$/part by weight | — | — | 1 | 2 | 1 |
| (B) FR-1/part by weight | 15 | 9 | 10 | 10 | 7 |
| FR-2/part by weight | — | — | — | — | — |
| PPE-5/part by weight | — | 22 | 24 | — | 48 |
| PPE-3/part by weight | — | — | — | 15 | — |
| HIPS/part by weight | 60 | 53 | 50 | 62 | 34 |
| PS/part by weight | 40 | 16 | 16 | 23 | 11 |
| PTFE/part by weight | — | — | 1 | — | — |
| [UL-94] 1.6 mm | V-2 | V-2 | V-1 | V-2 | V-0 |
| Smoke emission at burning | ○ | ○ | ○ | ○ | ○ |
| Extrudability | ○ | ○ | ○ | ○ | ○ |

TABLE 16

|  | Example 55 | Example 56 | Example 57 | Example 58 | Example 59 | Example 60 |
|---|---|---|---|---|---|---|
| (A) $Fe_2O_3$/part by weight | 5.0 | 1.0 | 1.0 | — | — | — |
| $Fe_3O_4$/part by weight | — | — | — | 1.0 | — | — |
| TIC-8048D/part by weight | — | — | — | — | 1.0 | — |
| $Nb_2O_5$/part by weight | — | — | — | — | — | 5.0 |
| (B) FR-1/part by weight | 5.0 | 5.0 | 7.5 | 7.5 | 7.5 | 5.0 |
| PPE-5/part by weight | 36.0 | 36.0 | 36.0 | 36.0 | 36.0 | 36.0 |
| HIPS/part by weight | 37.0 | 37.0 | 37.0 | 37.0 | 37.0 | 37.0 |
| GPPS/part by weight | 12.0 | 12.0 | 12.0 | 12.0 | 12.0 | 12.0 |
| [UL-94] 1.6 mm |  |  |  |  |  |  |
| Average burning time/sec | 6.4 | 7.1 | 4.0 | 3.8 | 6.2 | 7.6 |
| Maximum burning time/sec | 12.1 | 10.8 | 8.1 | 7.8 | 10.9 | 14.2 |
| Smoke emission at burning | ○ | ○ | ○ | ○ | ○ | ○ |
| DTUL/° C. | 114.7 | 112.0 | 109.9 | 110.4 | 109.8 | 114.8 |
| Dielectric properties [1 GHz] |  |  |  |  |  |  |
| Relative dielectric constant | 2.63 | 2.60 | 2.61 | 2.61 | 2.62 | — |
| MD | ○ | ○ | ○ | ○ | ○ | ○ |

TABLE 17

|  | Example 61 | Comparative Example 28 | Comparative Example 29 | Comparative Example 30 | Comparative Example 31 | Comparative Example 32 | Comparative Example 33 |
|---|---|---|---|---|---|---|---|
| (A) NiO/part by weight | 5.0 | — | — | — | — | — | — |
| $MoO_3$/part by weight | — | 5.0 | — | — | — | — | — |
| ZnO/part by weight | — | — | 5.0 | — | — | — | — |
| SH710/part by weight | — | — | — | 5.0 | — | — | — |
| $Fe_2O_3$/part by weight | — | — | — | — | — | — | 5.0 |
| (B) FR-1/part by weight | 5.0 | 5.0 | 5.0 | 5.0 | — | 5.0 | — |
| PPE-5/part by weight | 36.0 | 36.0 | 36.0 | 36.0 | 36.0 | 36.0 | 36.0 |
| HIPS/part by weight | 37.0 | 37.0 | 37.0 | 37.0 | 37.0 | 37.0 | 37.0 |
| GPPS/part by weight | 12.0 | 12.0 | 12.0 | 12.0 | 12.0 | 12.0 | 12.0 |
| [UL-94] 1.6 mm |  |  |  |  |  |  |  |
| Average burning time/sec | 7.4 | 12.4 | 12.9 | 9.1 | 55.9 | 10.5 | 51.4 |
| Maximum burning time/sec | 10.8 | 26.6 | 22.7 | 18.1 | 65.3 | 16.8 | 83.6 |
| Smoke emission at burning | ○ | ○ | ○ | ○ | X | ○ | X |
| DTUL/° C. | 114.3 | 115.7 | 114.9 | 112.6 | 119.0 | 112.9 | 120.5 |
| Dielectric properties [1 GHz] |  |  |  |  |  |  |  |
| Relative dielectric constant | — | 2.67 | 2.63 | 2.60 | 2.56 | 2.58 | 2.62 |
| MD | ○ | ○ | ○ | ○ | ○ | ○ | ○ |

TABLE 18

|  | Example 62 | Comparative Example 34 | Comparative Example 35 | Comparative Example 36 |
|---|---|---|---|---|
| (A) $Fe_2O_3$/part by weight | 1.0 | 1.0 | — | — |
| $Fe_3O_4$/part by weight | — | — | 1.0 | 1.0 |
| (B) FR-1/part by weight | 7.5 | — | 7.5 | — |
| FR-3/part by weight | — | 7.5 | — | 7.5 |
| PPE-5/part by weight | 36.0 | 36.0 | 36.0 | 36.0 |
| HIPS/part by weight | 37.0 | 37.0 | 37.0 | 37.0 |
| GPPS/part by weight | 12.0 | 12.0 | 12.0 | 12.0 |
| [UL-94] 1.6 mm |  |  |  |  |
| Average burning time/sec | 4.0 | 8.3 | 3.8 | 6.2 |
| Maximum burning time/sec | 8.1 | 15.5 | 7.8 | 14.2 |
| Smoke emission at burning | ○ | X | ○ | Δ |
| DTUL/° C. | 109.9 | 108.3 | 110.4 | 109.8 |
| Izod impact strength/kg·cm/cm | 12.6 | 11.3 | 12.1 | 11.4 |
| Extrudability | ○ | X | ○ | X |
| MD | ○ | X | ○ | X |

TABLE 19

|  | Example 63 | Example 64 | Comparative Example 37 |
|---|---|---|---|
| (A) $Fe_2O_3$/part by weight | 5.0 | — | — |
| $V_2O_5$/part by weight | — | 5.0 | — |
| (B) FR-1/part by weight | 5.0 | 5.0 | 5.0 |
| PPE-5/part by weight | 36.0 | 36.0 | 36.0 |
| HIPS/part by weight | 37.0 | 37.0 | 37.0 |
| GPPS/part by weight | 12.0 | 12.0 | 12.0 |
| [UL-94] thickness 3.2 mm |  |  |  |
| Average burning time/sec | 3.8 | 3.8 | 5.6 |
| Maximum burning time/sec | 5.9 | 9.4 | 15.1 |
| Smoke emission at burning | ○ | ○ | ○ |
| DTUL/° C. | 114.7 | 114.4 | 112.9 |

TABLE 20

|  | Example 65 | Example 66 | Comparative Example 38 | Comparative Example 39 | Comparative Example 40 | Comparative Example 41 |
|---|---|---|---|---|---|---|
| (A) P-1/part by weight | 5.0 | — | — | — | 5.0 | — |
| P-2/part by weight | — | 1.0 | — | — | — | 1.0 |
| (B) FR-1/part by weight | 5.0 | 7.5 | — | 5.0 | — | — |
| FR-3/part by weight | — | — | — | — | — | 7.5 |
| PPE-5/part by weight | 36.0 | 36.0 | 36.0 | 36.0 | 36.0 | 36.0 |
| HIPS/part by weight | 37.0 | 37.0 | 37.0 | 37.0 | 37.0 | 37.0 |
| GPPS/part by weight | 12.0 | 12.0 | 12.0 | 12.0 | 12.0 | 12.0 |
| [UL-94] thickness 1.6 mm |  |  |  |  |  |  |
| Average burning time/sec | 5.1 | 4.8 | 55.9 | 10.5 | 18.9 | 9.2 |
| Maximum burning time/sec | 8.9 | 8.7 | 65.3 | 16.8 | 31.2 | 17.8 |
| Smoke emission at burning | ○ | ○ | X | ○ | X | X |
| DTUL/° C. | 101.6 | 107.3 | 119.0 | 112.9 | 109.7 | 106.4 |
| Extrudability | ○ | ○ | ○ | ○ | ○ | X |
| Dielectric properties [1 GHz] |  |  |  |  |  |  |
| Relative dielectric constant | 2.60 | 2.59 | 2.56 | 2.58 | 2.57 | 2.61 |

TABLE 21

|  | Example 67 | Comparative Example 42 | Comparative Example 43 | Example 68 | Comparative Example 44 | Example 69 |
|---|---|---|---|---|---|---|
| (A) CuO/part by weight | 3 | — | 3 | 3 | — | 2 |
| (B) FR-2/part by weight | 15 | 15 | — | 15 | 15 | 15 |
| FR-3/part by weight | — | — | 15 | — | — | — |
| PPE-6/part by weight | 50 | 50 | 50 | 50 | 50 | 35 |
| PA66/part by weight | 50 | 50 | 50 | — | — | — |
| PA66/6I/part by weight | — | — | — | 50 | 50 | — |
| PA6T/6I/part by weight | — | — | — | — | — | 65 |
| [UL-94] 1.6 mm | V-0 | V-1 | V-2 | V-0 | V-1 | V-0 |
| Average burning time/sec | 5.0 | 14.8 | 7.2 | 4.0 | 7.6 | 4.7 |
| Maximum burning time/sec | 8.3 | 28.2 | 18.3 | 9.0 | 16.4 | 9.3 |
| Smoke emission at burning | ○ | X | X | ○ | ○ | ○ |
| Releasability | ○ | ○ | X | ○ | ○ | ○ |

TABLE 22

|  | Example 70 | Comparative Example 45 | Comparative Example 46 |
|---|---|---|---|
| (A) Fe$_3$O$_4$/part by weight | 3 | — | 3 |
| Mg(OH)$_2$/part by weight | — | 3 | — |
| (B) FR-1/part by weight | 12 | 12 | — |
| FR-3/part by weight | — | — | 12 |
| ABS/part by weight | 100 | 100 | 100 |
| [UL-94] 1.6 mm | V-2 | V out | V out |
| Extrudability | ○ | ○ | X |

TABLE 23

|  | Example 71 | Comparative Example 47 | Comparative Example 48 | Comparative Example 49 | Example 72 | Comparative Example 50 |
|---|---|---|---|---|---|---|
| (A) Fe$_3$O$_4$/part by weight | 2.0 | — | — | 2.0 | 2.0 | 2.0 |
| SH710/part by weight | — | — | 2.0 | — | — | — |
| (B) FR-1/part by weight | 7.0 | 7.0 | 7.0 | — | 5.0 | — |
| FR-3/part by weight | — | — | — | 7.0 | — | 5.0 |
| PC/part by weight | 85.0 | 85.0 | 85.0 | 85.0 | 100 | 100 |
| ABS/part by weight | 15.0 | 15.0 | 15.0 | 15.0 | — | — |
| [UL-94] 1.6 mm |  |  |  |  |  |  |
| Average burning time/sec | 4.7 | 8.7 | 8.6 | 12.3 | 4.1 | 8.3 |
| Maximum burning time/sec | 9.1 | 14.3 | 15.4 | 21.7 | 9.7 | 16.6 |
| Smoke emission at burning | ○ | ○ | ○ | X | ○ | X |

Industrial Applicability

The flame retardant composition according to the present invention which comprises (A) at least one compound selected from a specific metal oxide and a trivalent phosphorus compound, (B) a specific phosphazene compound and, if necessary, (C) an aromatic resin, especially when added to resins, provides flame retardant resin compositions excellent in flame retardance, low smoke emission, heat resistance, moisture absorption resistance, dielectric properties, extrudability, mold releasability, thermal stability, mechanical properties. Therefore, the composition of the present invention can be suitably used for flame retardants for resins, rubbers, lubricants, lithium ion batteries, solar batteries, fuel cells, non-flammable electrolytes, battery applications, releasing agents, releasing films, roughened surface forming materials, water repellants, etc.

Furthermore, the flame retardant resin composition using the flame retardant composition of the present invention can be suitably used for electric and electronic equipment parts such as coil bobbins, flyback transformers, connectors and deflecting yokes; electric and electronic materials such as printed wiring boards, printed circuit boards, sealers, electric insulating materials, electric coating agents, laminate board, varnish for high-speed operation, advanced composite materials, electric wires, aerial materials, cables and high-performance molding materials; paints, adhesives, coating materials, tableware, buttons, fiber and paper treating agents, decorative sheets, UV hardening type inks, sealants, synthetic leathers, heat insulating cushioning materials, coating film waterproofing materials, corrosion-resistant linings, binders for mold, lacquers, paints, ink modifying agents, resin modifying materials, aircraft interior parts, matrixes for composite materials, utensils, OA equipments, AV equipments, battery applications, lighting units, automobile parts, housings, ETC, ITC, portable telephones, etc.

The invention claimed is:

1. A flame retardant composition which comprises:
(A) at least one compound selected from the group consisting of (A-1) a metal oxide represented by the formula M$_x$O$_y$ (in the formula, M is at least one element selected from the elements of Groups 5, 8, 10 and 11 of the Periodic Table, and x and y are numerals satisfying 0<x≤5 and 0<y≤5, respectively) and (A-2) a trivalent phosphorus compound; and (B) at least one phosphazene compound containing 80% by weight or more of cyclic trimers, and which is selected from a cyclic phosphazene compound represented by the following formula (2) and a chain phosphazene compound represented by the following formula (3), wherein n is an integer of 3-25, m is an integer of 3-10000, the substituents X are independently an alkyl group of 1-6 carbon atoms, an aryl group of 6-11 carbon atoms, a fluorine atom, an aryloxy group having a substituent represented by the formula (4) (in the formula, R$_1$, R$_2$ R$_3$, R$_4$ and R$_5$ independently represent a substituent selected from the group consisting of hydrogen atom, fluorine atom, an alkyl group of 1-5 carbon atoms, an alkoxy group of 1-5 carbon atoms, and a phenyl group), a naphthyloxy group, an alkoxy group of 1-6 carbon atoms, or an alkoxy-substituted alkoxy group (a part or all of hydrogen atoms on the substituents may be substituted with fluorine), Y in the formula represents —N=P(O)(X) or —N=P(X)$_3$ and Z represents —P(X)$_4$ or -P(O)(X)$_2$

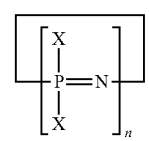

(2)

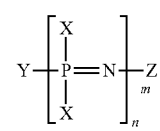

(3)

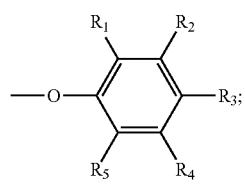

(4)

wherein 90% or more of the total amount of the substituents on the phosphorous atom of said at least one phosphazene compound comprises unsubstituted or substituted phenoxy group;

wherein the flame retardant composition contains 0.1-60 parts by weight of the component (A) and 99.9-40 parts by weight of the component (B) in 100 parts by weight of the component (A) and the component (B) in total, and wherein said at least one phosphazene compound has a difference of 40-100° C. between the temperature at which weight reduction is 50% by weight and the temperature at which the weight reduction is 5% by weight when it is heated from room temperature to 600° C. at a heating rate of 10° C/min in an inert gas atmosphere according to TGA.

2. The flame retardant composition according to claim 1, wherein the component (B) has an acid value of not more than 1.0 and the component (B) has a water content of not more than 1000 ppm measured at 150° C. according to Karl Fischer's method.

3. The flame retardant composition according to claim 1, wherein the temperature at which the weight reduction of the component (B) is 50% by weight is 320-460° C. when it is heated from room temperature to 600° C. at a heating rate of 10° C/min in an inert gas atmosphere according to TGA.

4. The flame retardant composition according to claim 1, wherein the metal M in the component (A-1) is at least one metal selected from the group consisting of V, Nb, Fe, Ni, Pd, Pt, Cu, Ag and Au.

5. The flame retardant composition according to claim 1, wherein the component (A-1) is at least one compound selected from the group consisting of iron oxide, nickel oxide, palladium oxide and copper oxide.

6. The flame retardant composition according to claim 1, wherein the temperature at which the weight reduction of the component (A-2) is 10% is 120-320° C. when it is heated from room temperature to 600° C. at a heating rate of 10° C/min in an inert gas atmosphere according to TGA.

7. The flame retardant composition according to claim 1, wherein the component (A-2) is at least one of tertiary phosphines.

8. The flame retardant composition according to claim 1, wherein the component (A-2) is at least one of triarylphosphines.

9. The flame retardant composition according to claim 1 which further comprises (C) an aromatic resin.

10. The flame retardant composition according to claim 9, wherein the component (C) is at least one resin selected from the group consisting of polyphenylene ether resins, polycarbonate resins, polyphenylene sulfide resins, phenolic resins, aromatic polyamide resins, polyester resins and thermotropic liquid crystals.

11. The flame retardant composition according to claim 9, wherein the component (C) is a polyphenylene ether resin.

12. The flame retardant composition according to claim 9, wherein the weight ratio of the component (C) and the component (B) is (C)/(B) =95/5 -5/95.

13. A flame retardant resin composition which comprises the flame retardant composition described in claim 9.

14. A flame retardant resin composition which contains (a) a resin and (b) the flame retardant composition described in claim 1.

15. The flame retardant resin composition according to claim 14 which contains 1-1000 parts by weight of the component (b) based on 100 parts by weight of the component (a).

16. The flame retardant resin composition according to claim 14, wherein the component (a) comprises at least one thermoplastic resin selected from the group consisting of polycarbonate resins, polyphenylene ether resins, polyphenylene sulfide resins, polypropylene resins, polyethylene resins, polystyrene resins, ABS resins, polyalkylene terephthalate resins, polyamide resins, thermotropic liquid crystals and elastomer-containing polystyrenes.

17. The flame retardant resin composition according to claim 14, wherein the component (a) is at least one resin selected from the group consisting of polyphenylene ether resins, polycarbonate resins, polystyrene resins, ABS resins and elastomer-containing polystyrenes, and the component (A-1) in the flame retardant composition which is the component (b) is iron oxide and/or copper oxide.

18. The flame retardant resin composition according to claim 14, wherein the component (a) is at least one resin selected from the group consisting of polyphenylene ether resins, polycarbonate resins, polystyrene resins, ABS resins and elastomer-containing polystyrenes, and the component (A-2) in the flame retardant composition which is the component (b) is at least one phosphine selected from triarylphosphines.

19. The flame retardant resin composition according to claim 14, wherein the component (a) comprises at least one hardening resin selected from the group consisting of unsaturated polyester resins, vinyl ester resins, diallyl phthalate resins, epoxy resins, cyanate resins, xylene resins, triazine resins, phenolic resins, urea resins, melamine resins, benzoguanamine resins, urethane resins, ketone resins, alkyd resins, furan resins, oxetane resins, styrylpyridine resins and synthetic rubbers.

20. The flame retardant resin composition according to claim 14, wherein the component (a) is an epoxy resin, and the component (A-1) in the flame retardant composition which is the component (b) is at least one oxide selected from nickel oxide, palladium oxide, iron oxide and copper oxide.

21. The flame retardant resin composition according to claim 14, wherein the component (a) is an epoxy resin, and the component (A-2) in the flame retardant composition which is the component (b) is at least one phosphine selected from triarylphosphines.

22. The flame retardant resin composition according to claim 14 or 15, wherein the component (a) is an epoxy resin, and the component (b) further comprises (C) an aromatic resin which is a polyphenylene ether resin having a number average molecular weight of 500-5000.

23. A molded article comprising the flame retardant resin composition according to claim 13.

* * * * *